(12) United States Patent
Fong et al.

(10) Patent No.: US 7,259,956 B2
(45) Date of Patent: Aug. 21, 2007

(54) SCALABLE INTEGRATED CIRCUIT HIGH DENSITY CAPACITORS

(75) Inventors: Victor Chiu-Kit Fong, San Jose, CA (US); Eric Bruce Blecker, San Jose, CA (US); Tom W. Kwan, Cupertino, CA (US); Ning Li, Fremont, CA (US); Sumant Ranganathan, Sunnyvale, CA (US); Chao Tang, Mountain View, CA (US); Pieter Vorenkamp, Laguna Niguel, CA (US)

(73) Assignee: Broadcom Corporation, Irvine, CA (US)

( * ) Notice: Subject to any disclaimer, the term of this patent is extended or adjusted under 35 U.S.C. 154(b) by 78 days.

(21) Appl. No.: 11/013,789

(22) Filed: Dec. 17, 2004

(65) Prior Publication Data
US 2005/0135042 A1 Jun. 23, 2005

Related U.S. Application Data

(60) Provisional application No. 60/530,648, filed on Dec. 19, 2003.

(51) Int. Cl.
*H01G 4/228* (2006.01)
(52) U.S. Cl. .............. 361/306.2; 361/306.1; 361/301.1; 361/321.2; 361/303; 361/311; 361/313
(58) Field of Classification Search ........... 361/303, 361/306.1, 306.2, 306.3, 301.1, 311–313, 361/321.2; 257/532, 534
See application file for complete search history.

(56) References Cited

U.S. PATENT DOCUMENTS

| | | | | |
|---|---|---|---|---|
| 5,583,359 A | * | 12/1996 | Ng et al. ............... | 257/306 |
| 5,872,695 A | * | 2/1999 | Fasano et al. .......... | 361/301.4 |
| 5,939,766 A | * | 8/1999 | Stolmeijer et al. ....... | 257/534 |
| 6,061,228 A | * | 5/2000 | Palmer et al. .......... | 361/306.2 |
| 6,066,537 A | * | 5/2000 | Poh ...................... | 438/393 |
| 6,414,835 B1 | * | 7/2002 | Wolf et al. ............. | 361/302 |
| 6,653,681 B2 | | 11/2003 | Appel | |
| 6,690,570 B2 | | 2/2004 | Hajimiri et al. | |
| 6,801,422 B2 | * | 10/2004 | Mosley ................. | 361/306.3 |
| 6,933,551 B1 | * | 8/2005 | Stribley et al. ......... | 257/296 |
| 7,009,832 B1 | | 3/2006 | Chen et al. | |
| 7,151,660 B2 | | 12/2006 | Chen et al. | |
| 2003/0206389 A1 | | 11/2003 | Hajimiri et al. | |
| 2004/0031982 A1 | | 2/2004 | Devries et al. | |

OTHER PUBLICATIONS

Roberto Aparicio, *Student Member, IEEE*, and Ali Hajimiri, *Member, IEEE*; Capacity Limits and Matching Properties of Integrated Capacitors; IEEE Journal of Solid-State Circuits, pp. 384-393, vol. 37, No. 3, Mar. 2002.

Hirad Samavati, *Student Member, IEEE*, Ali Hajimiri, Arvin R. Shahani, Gitty N. Nasserbakht, and Thomas H. Lee, *Member, IEEE*; Fractal Capacitors; IEEE Journal of Solid-State Circuits, pp. 2035-2041, vol. 33, No. 12, Dec. 1998.

(Continued)

*Primary Examiner*—Nguyen T. Ha
(74) *Attorney, Agent, or Firm*—Sterne, Kessler, Goldstein & Fox P.L.L.C.

(57) ABSTRACT

The present invention provides several scalable integrated circuit high density capacitors and their layout techniques. The capacitors are scaled, for example, by varying the number of metal layers and/or the area of the metal layers used to from the capacitors. The capacitors use different metallization patterns to form the metal layers, and different via patterns to couple adjacent metal layers. In embodiments, optional shields are included as the top-most and/or bottom-most layers of the capacitors, and/or as side shields, to reduce unwanted parasitic capacitance.

6 Claims, 37 Drawing Sheets

OTHER PUBLICATIONS

Jay Rajagopalan and Haris Basit; Optimization of Metal-Metal Comb-Capacitors for RF Applications, 4 pages, http://www.oea.com/document/Optimiz_Metal.pdf., Jan. 12, 2006.

Tirdad Sowlati, Vickram Vathulya and Domine Leenaerts; High Density Capacitance Structures in Submicron CMOS for Low Power RF Applications, ISLPED '01, Aug. 6-7, 2001, pp. 243-246.

* cited by examiner

SCALABLE INTEGRATED CIRCUIT HIGH DENSITY CAPACITORS

CROSS REFERENCE TO RELATED APPLICATION

This application claims the benefit of U.S. Provisional Patent Application No. 60/530,648, filed Dec. 19, 2003, which is incorporated herein by reference in its entirety.

FIELD OF THE INVENTION

The present invention relates to capacitors. More particularly, it relates to integrated circuit capacitors.

BACKGROUND OF THE INVENTION

Advances in semiconductor manufacturing technology have led to the integration of millions of circuit elements on a single integrated circuit. In order to integrate these increasing numbers of circuit elements onto an integrated circuit, it has been necessary to reduce the dimensions of the various component parts, including capacitors, which are basic building blocks for electrical circuits. Therefore, a need exists for new capacitors that improve area utilization and/or integrated circuit performance.

BRIEF SUMMARY OF THE INVENTION

The present invention provides several scalable integrated circuit high density capacitors and their layout techniques. The capacitors are scalable in that they can be formed using a selected number of metal layers and the area of these metal layers is variable.

It is a feature of the present invention that optional shields can be included as the top-most and/or bottom-most layers of the capacitors, as well as one or more sides of the capacitors, to reduce unwanted parasitic capacitance.

Further embodiments, features, and advantages of the present invention, as well as the structure and operation of the various embodiments of the present invention, are described in detail below with reference to the accompanying drawings.

DETAILED DESCRIPTION OF THE PREFERRED EMBODIMENTS

The present invention provides scalable integrated circuit high density capacitors and their layout techniques. The figures detail the capacitor structures, graphically. In an embodiment of the present invention, optional shields designated as top-most and/or bottom-most layers of the capacitor structure, and/or optional side shields, are connected to nodes other than the capacitor's terminals (i.e., A or B) to help reduce unwanted parasitic capacitance from terminals A and/or B to other circuit nodes. In an embodiment, optional shields designated as top-most and/or bottom-most layers of the capacitor structure, and/or optional side shields, are connected to one of the capacitor's terminals (e.g., A) to minimize parasitic capacitance from the other capacitor terminal (e.g., B) to other circuit nodes.

Figure 1A:
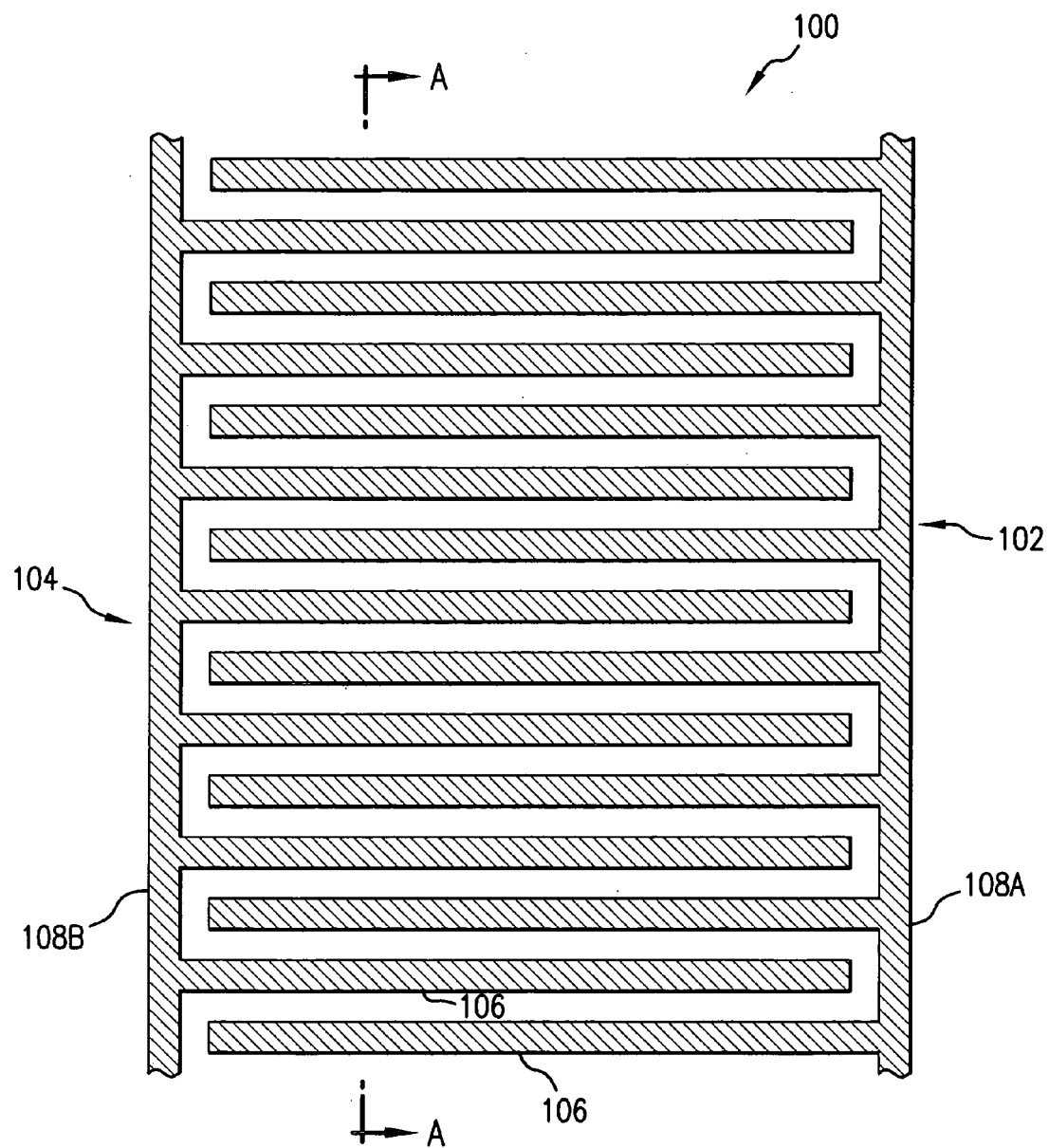
FIG. 1A is a schematic diagram depicting a top view of an example metal layer of a scalable integrated circuit stagger-structure high density capacitor according to an embodiment of the present invention.

FIG. 1A is a schematic diagram depicting a top view of an example metal layer 100 of a scalable integrated circuit stagger-structure high density capacitor 150 (see FIG. 1B) according to an embodiment of the present invention. As shown in FIG. 1A, metal layer 100 includes two metallization patterns 102 and 104. Metallization pattern 102 has a plurality of finger tracks 106 coupled approximately perpendicular to a backbone track 108A. Similarly, metallization pattern 104 has a plurality of finger tracks 106 coupled approximately perpendicular to a backbone track 108B. The fingers 106 of metallization patterns 102 and 104 are interlaced as shown in FIG. 1A. By approximately perpendicular, it is meant that the finger tracks 106 are sufficiently perpendicular so that they can be interlaced. The metallization patterns 102 and 104 can be formed using any conducting metal. In an embodiment, copper or aluminum is used to form metallization patterns 102 and 104, but the invention is not limited to these metals.

Figure 1B:
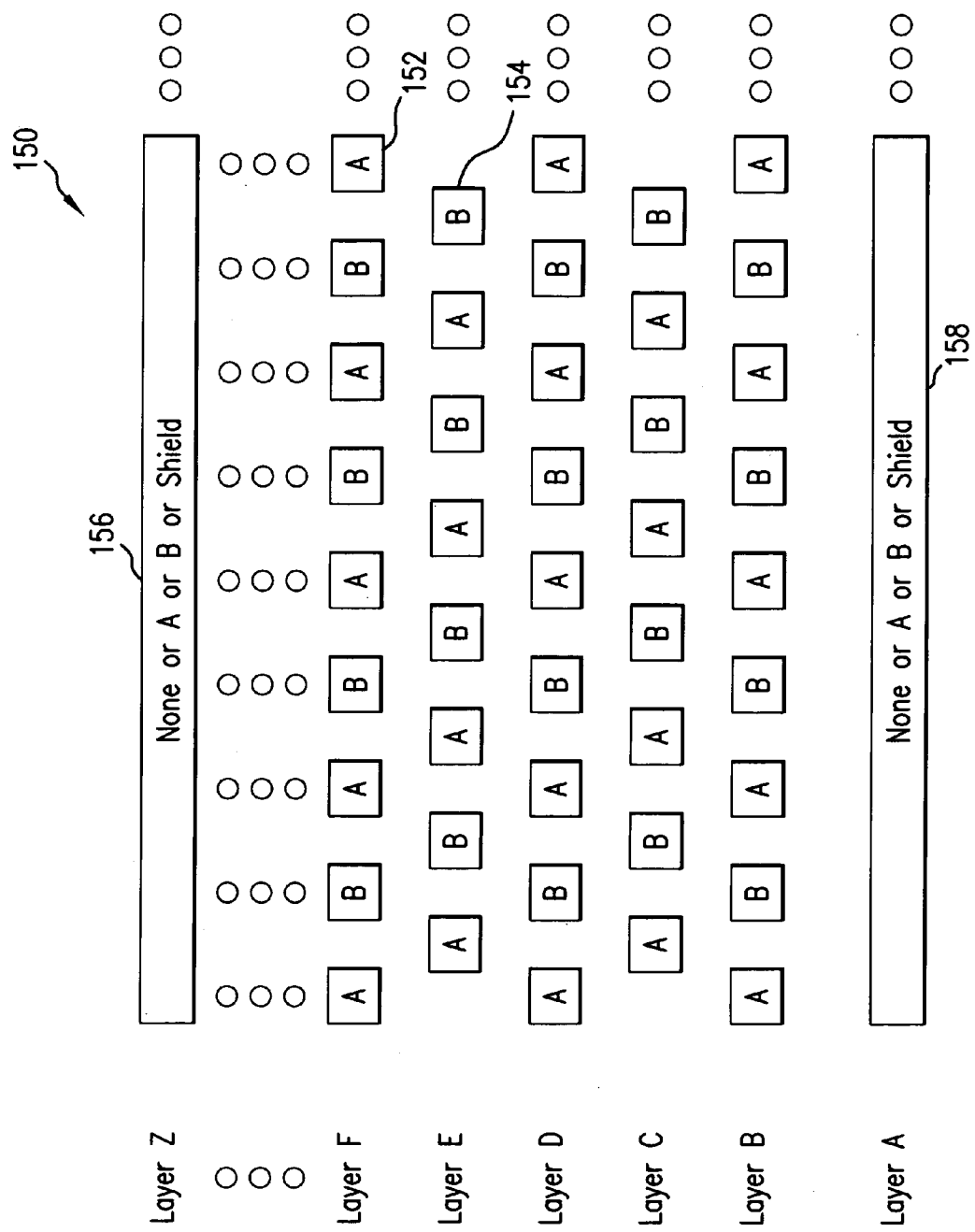
FIG. 1B is a schematic diagram depicting a cross sectional view (A—A) of the scalable integrated circuit stagger-structure high density capacitor of FIG. 1A.

FIG. 1B is a schematic diagram depicting a cross sectional view (A—A) (see FIG. 1A) of the scalable integrated circuit stagger-structure high density capacitor 150. As shown in FIG. 1B, capacitor 150 is scalable in that it can be formed using a selected number of metal layers such as, for example, metal layer 100. Additionally, the area of these metal layers can be varied to meet design requirements. Accordingly, the number and area of the metal layers illustrated for capacitor 150, or any other capacitor described herein, is not to be used to limit the invention. As shown in FIG. 1B, adjacent metal layers of capacitor 150 are staggered. This staggering is illustrated by the offset of portion 152 of metal layer F from portion 154 of metal layer E. Although the width of finger tracks 106 are depicted as being equal in size to the spacing between the finger tracks, in some embodiments, the widths of finger tracks 106 are selected to be larger than the spacing between the finger tracks so that finger tracks of adjacent metal layers overlap. In other embodiments, the widths of finger tracks 106 are selected to be smaller than the spacing between the finger tracks so that finger tracks of adjacent metal layers will not overlap.

Optional shields 156 and/or 158 can be included as the top-most and/or bottom-most layers of capacitor 150 to help reduce unwanted parasitic capacitance. In an embodiment, the shields 156 and/or 158 are connected to nodes other than the terminals (i.e., A and B shown in FIG. 1B) of capacitor 150. In another embodiment, shields 156 and/or 158, designated as top-most and/or bottom-most layers of capacitor 150, are connected to one of the capacitor's terminals (e.g., A) to minimize parasitic capacitance from the other capacitor terminal (e.g., B) to other circuit nodes. Any type of shield, including side shields (see FIG. 1D), can be used in accordance with the present invention. In embodiments, the shields 156 and 158 are formed, for example, using outer stripes of all conductive layers, metal plates, or any other known structure that can serve as a shield.

Figure 1C:
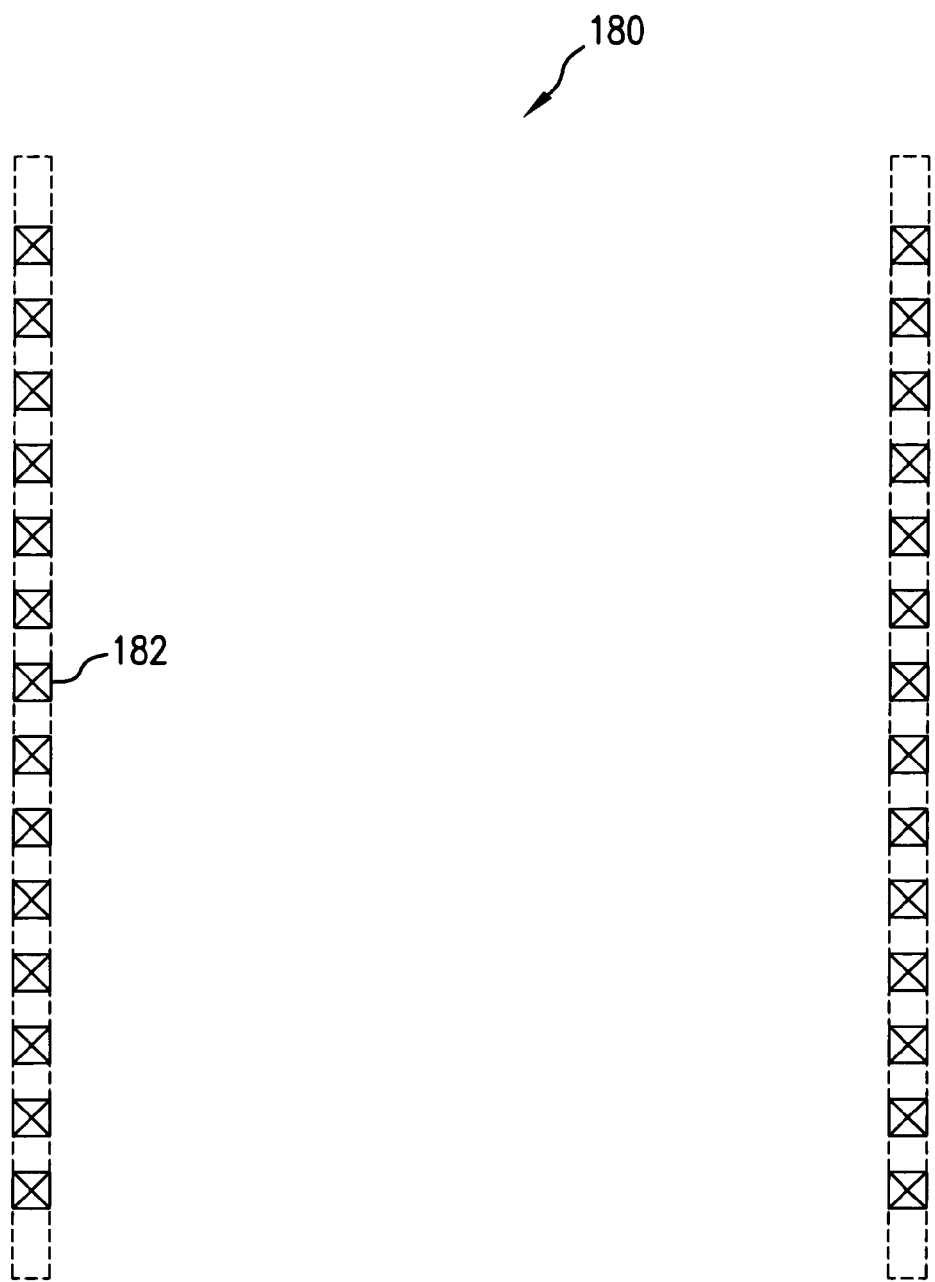
FIG. 1C is a schematic diagram depicting a top view of an example via layer of the scalable integrated circuit stagger-structure high density capacitor of FIG. 1A.

FIG. 1C is a schematic diagram depicting a top view of an example via layer 180 of the scalable integrated circuit stagger-structure high density capacitor 150. Via layer 180 includes a plurality of vias 182 used to couple adjacent metal layers of capacitor 150 such as, for example, two metal layers having the metallization patterns shown in FIG. 1A. The vias 182 shown in FIG. 1C couple together backbone tracks 108 of adjacent metal layers. The number and shape of the vias shown in FIG. 1C are only illustrative and not limiting. Via layers having more or less vias than shown in FIG. 1C can be used as well as vias of different shapes and/or sizes.

Figure 1D:
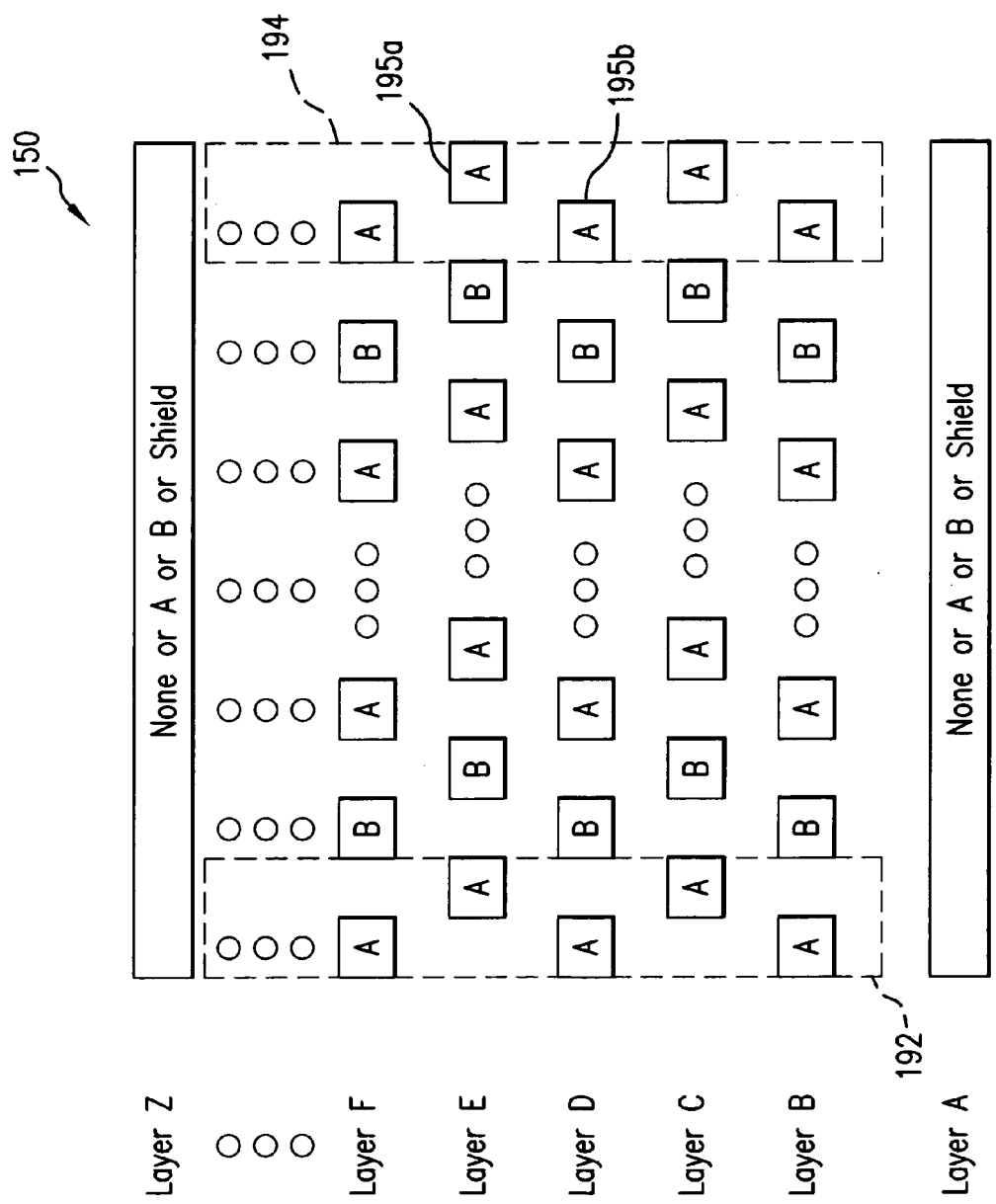
FIG. 1D is a schematic diagram depicting optional side shields for the scalable integrated circuit stagger-structure high density capacitor of FIG. 1A.

FIG. 1D illustrates optional side shields 192 and 194 for high density capacitor 150. In the embodiment shown in FIG. 1D, side shields 192 and 194 are formed using metal layers which have end finger tracks, such as end finger tracks 195a and 195b, that are associated with a particular terminal of capacitor 150 (.e.g., A). It is noted here, however, that this embodiment is only illustrative and not limiting. Any type of side shields can be used. For example, in one embodiment, the width of the end finger tracks 195 are varied so that the finger tracks overlap, either partially or completely. In another embodiment, side tracks are formed using stacked vias rather than end finger tracks.

In embodiments of the present invention, the optional side shields are connected to nodes other than the terminals (i.e., A and B) of capacitor 150. In one embodiment, the shields are connected to one of the capacitor's terminals (e.g., A as shown in FIG. 1D) to minimize parasitic capacitance from the other capacitor terminal (e.g., B) to other circuit nodes.

Figure 2A:
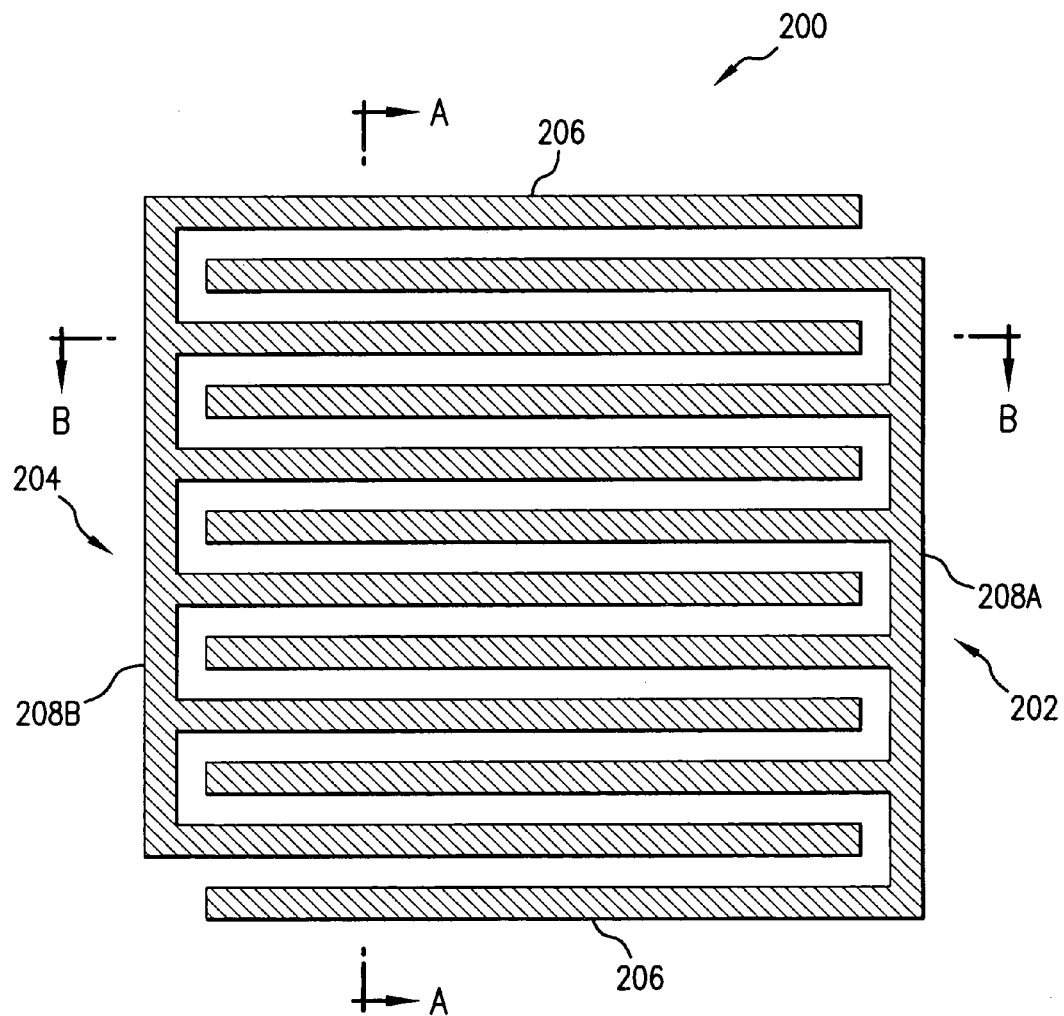
FIG. 2A is a schematic diagram depicting a top view of an example metal layer of a scalable integrated circuit cross-structure high density capacitor according to an embodiment of the present invention.

FIG. 2A is a schematic diagram depicting a top view of an example metal layer 200 of a scalable integrated circuit cross-structure high density capacitor 220 (see FIG. 2B) according to an embodiment of the present invention. As shown in FIG. 2A, metal layer 200 includes two metallization patterns 202 and 204. Metallization pattern 202 has a plurality of finger tracks 206 coupled approximately perpendicular to backbone track 208A. Metallization pattern 204 has a plurality of finger tracks 206 coupled approximately perpendicular to backbone track 208B. The finger tracks 206 of metallization patterns 202 and 204 are interlaced as shown in FIG. 2A. As with capacitor 150, the metallization patterns 202 and 204 can be formed using any conducting metal. For brevity, it is noted here that the metallization patterns for each of the capacitors described herein can be formed using any conducting metal so that this feature need not be repeated below in the description of other capacitor according to the present invention.

Figure 2B:
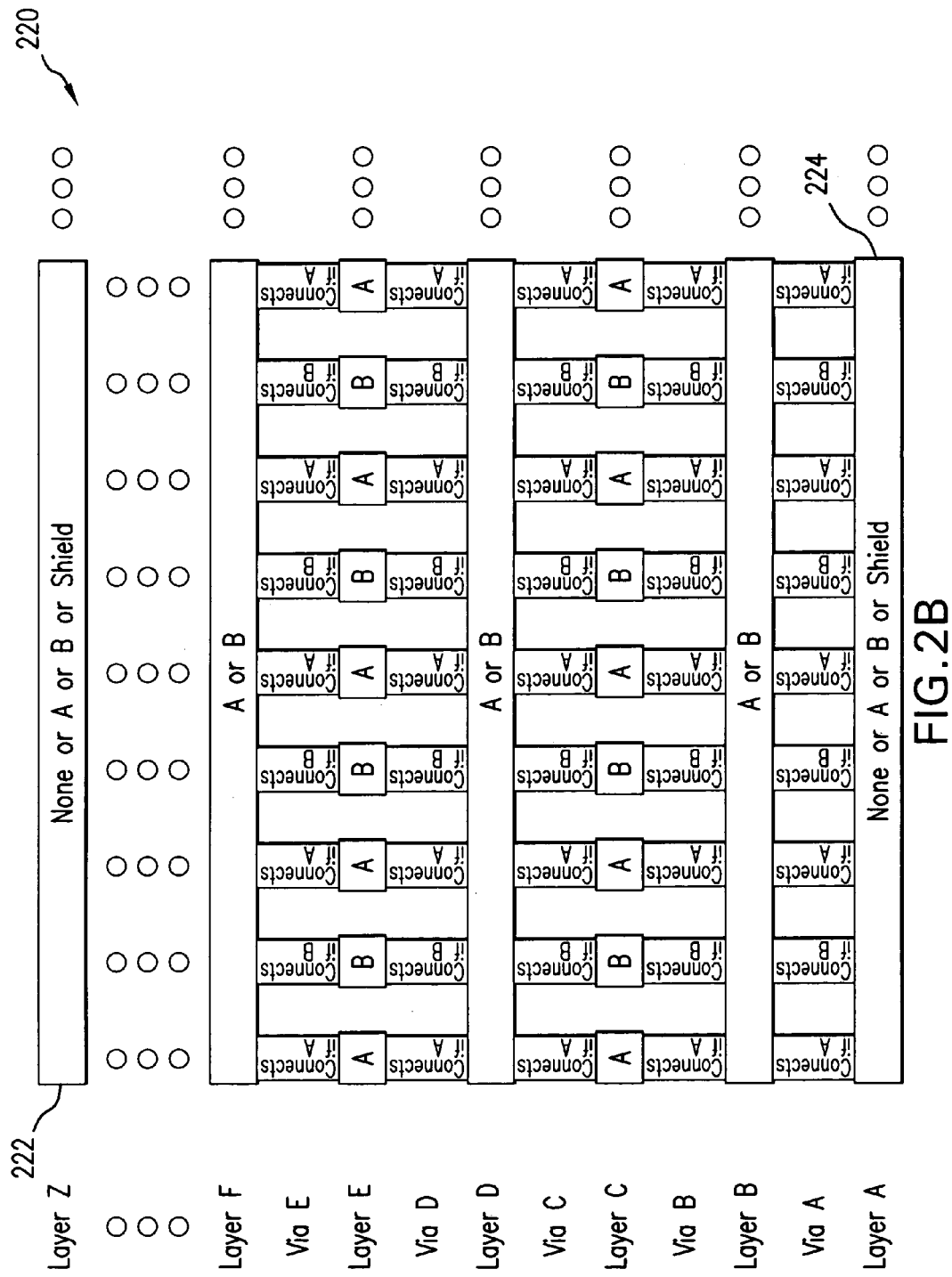
FIG. 2B is a schematic diagram depicting a cross sectional view (A—A) of the scalable integrated circuit cross-structure high density capacitor of FIG. 2A.

FIG. 2B is a schematic diagram depicting a cross sectional view (A—A) (see FIG. 2A) of the scalable integrated circuit cross-structure high density capacitor 220. As shown in FIG. 2B, capacitor 220 is scalable in that it can be formed using a selected number of metal layers such as, for example, metal layer 200, and the area of these metal layers can be varied, as is the case for each capacitor described herein. Optional shields 222 and/or 224 can be included as the top-most and/or bottom-most layers of capacitor 220, as well as optional side shields (not shown), to help reduce unwanted parasitic capacitance. Any type of shield can be used with capacitor 220 in accordance with the present invention, as with all the capacitors according to the present invention.

Figure 2C:
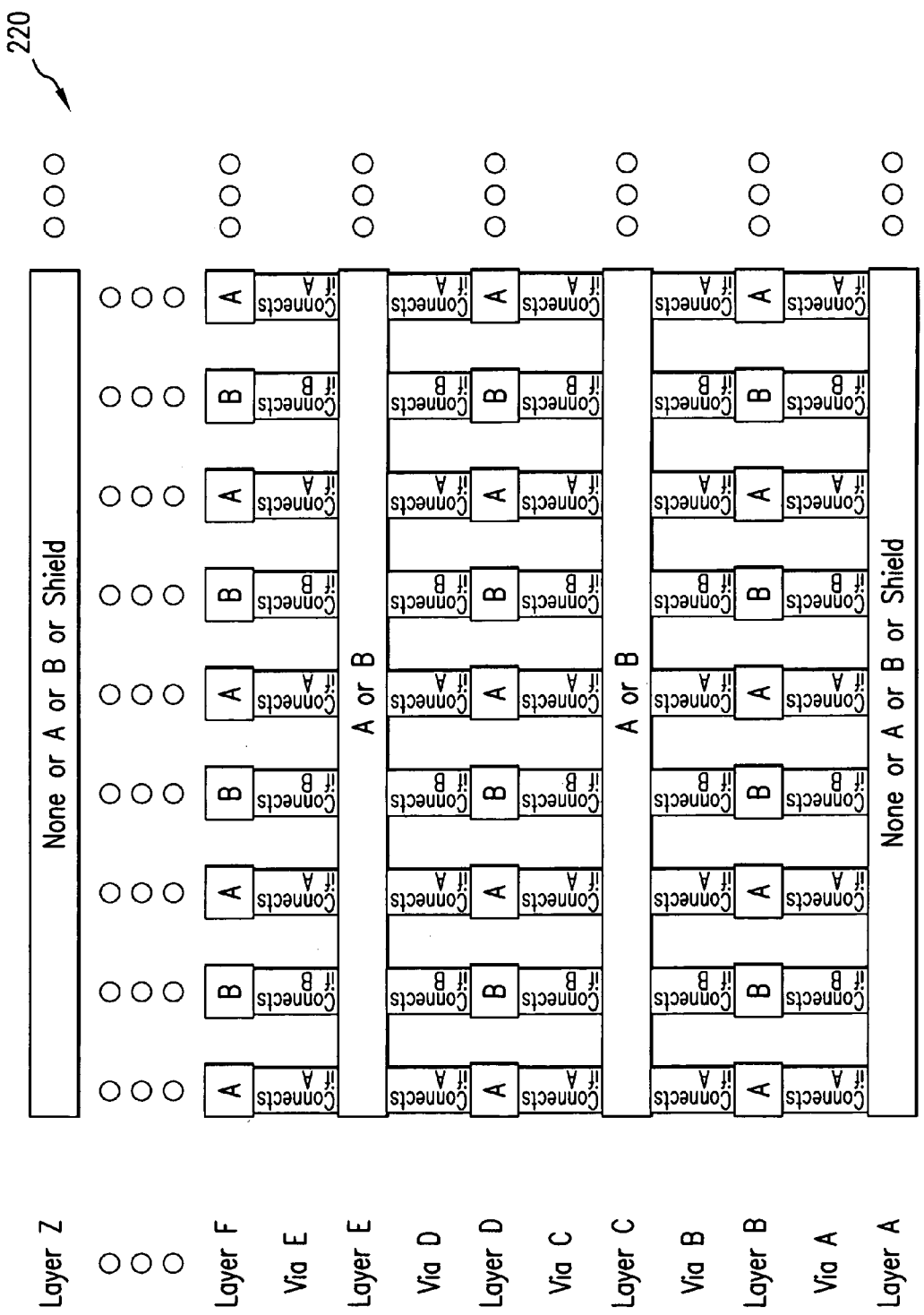
FIG. 2C is a schematic diagram depicting a cross sectional view (B—B) of the scalable integrated circuit cross-structure high density capacitor of FIG. 2A.

FIG. 2C is a schematic diagram depicting a cross sectional view (B—B) (see FIG. 2A) of the scalable integrated circuit cross-structure high density capacitor 220. FIG. 2B and FIG. 2C illustrate the relationship of the metal layers that make up capacitor 220. These figures also illustrate how the metal layers of capacitor 220 are coupled together by vias. The A's and B's shown in FIG. 2B and FIG. 2C depict whether a part is associated with a terminal A or a terminal B of capacitor 220.

Figure 2D:
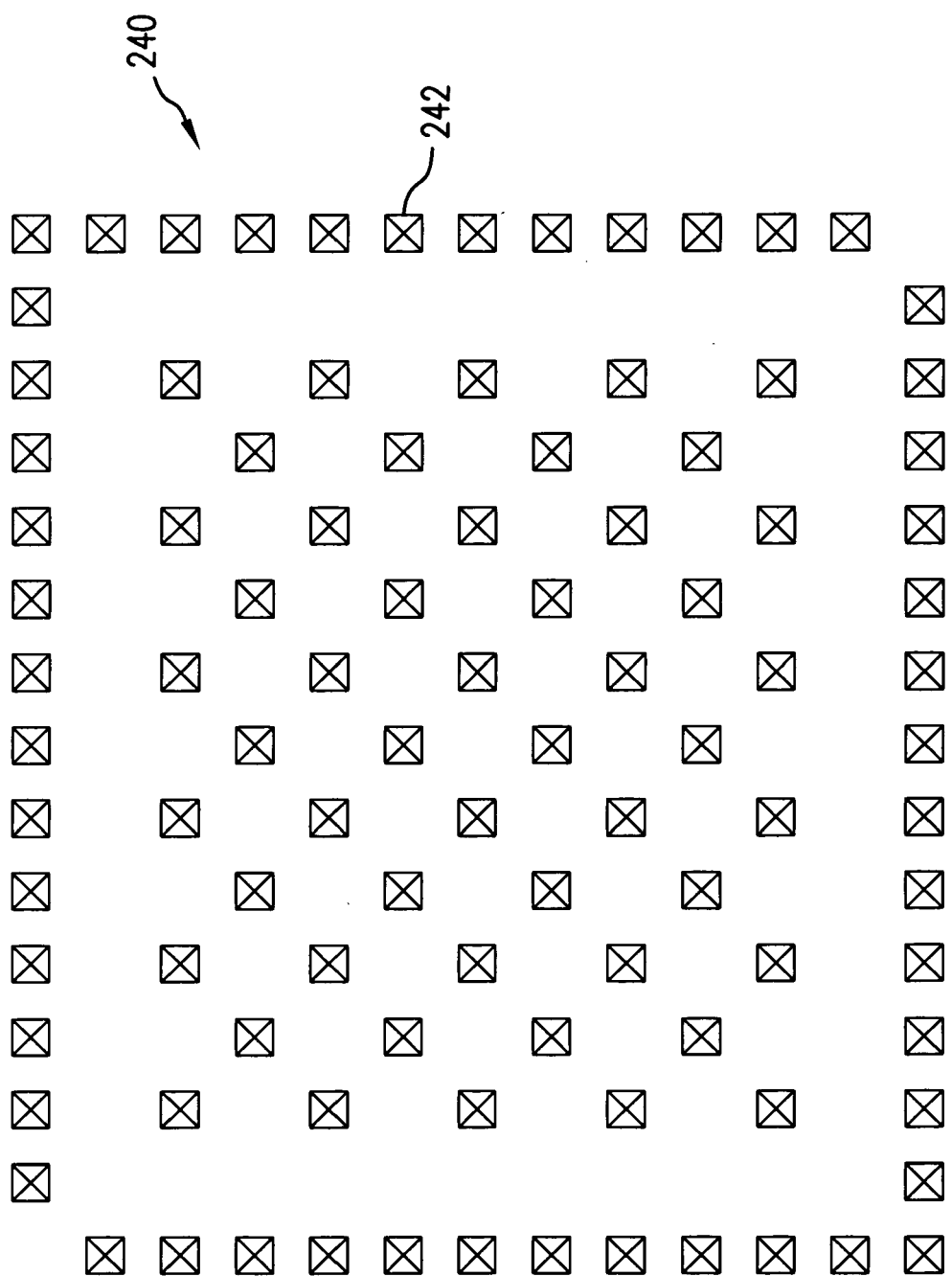
FIG. 2D is a schematic diagram depicting a top view of an example via layer of the scalable integrated circuit cross-structure high density capacitor of FIG. 2A.

FIG. 2D is a schematic diagram depicting a top view of an example via layer 240 of the scalable integrated circuit cross-structure high density capacitor 220. As shown in FIG. 2D, in an embodiment, both the finger tracks 206 and the backbone tracks 208 of selected metal layers are coupled together by vias 242.

Figure 3A:
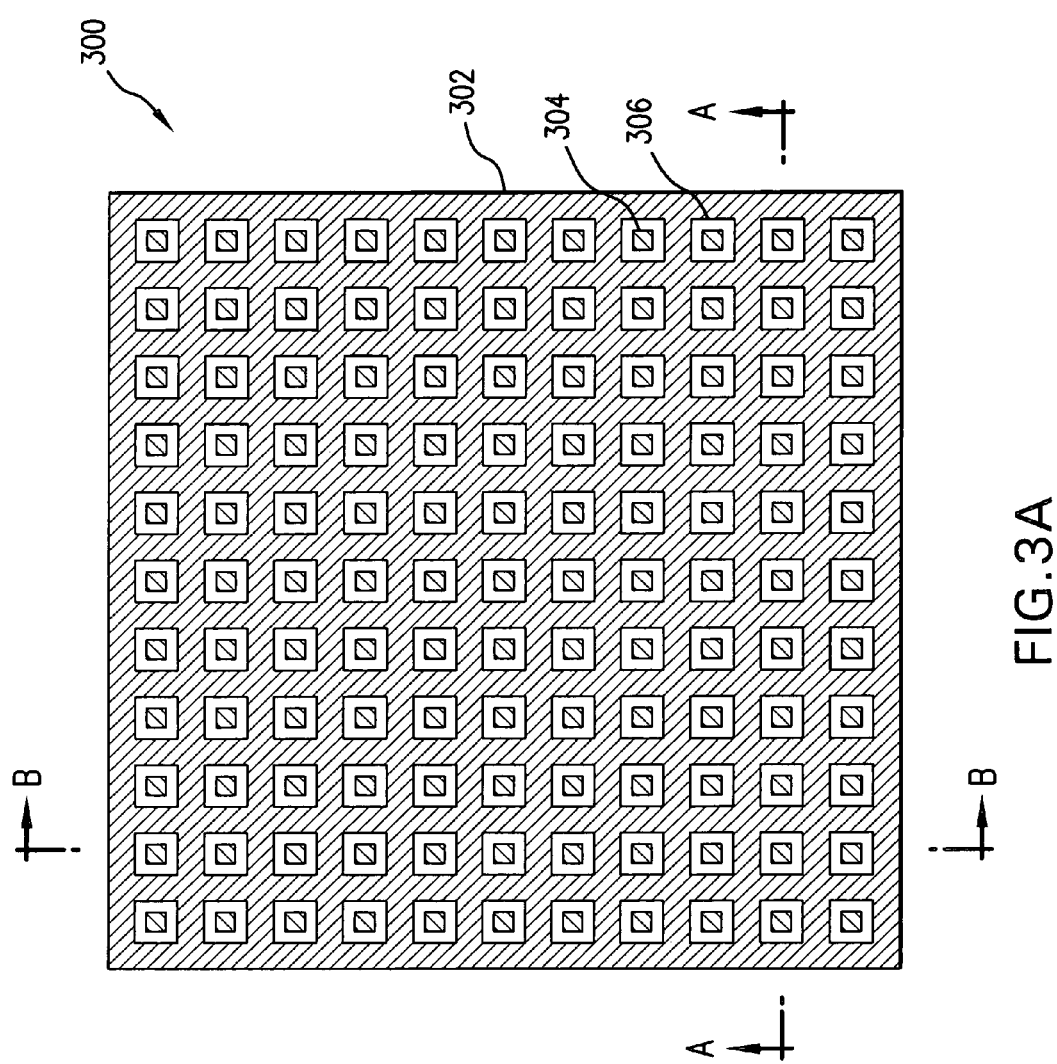
FIG. 3A is a schematic diagram depicting a top view of an example metal layer of a scalable integrated circuit loop-structure high density capacitor according to an embodiment of the present invention.

FIG. 3A is a schematic diagram depicting a top view of an example metal layer 300 of a scalable integrated circuit loop-structure high density capacitor 320 (see FIG. 3B) according to an embodiment of the present invention. As shown in FIG. 3A, metal layer 300 includes a metallization pattern 302 and a plurality of metallization patterns 304. The metallization pattern 302 has loop openings 306 in which the metallization patterns 304 are located. One metallization pattern 304 is located in each loop opening 306 of metallization pattern 302. The shapes of the metallization patterns and loop openings shown in FIG. 3A are illustrative only. Other shapes and/or sizes can be used.

Figure 3B:
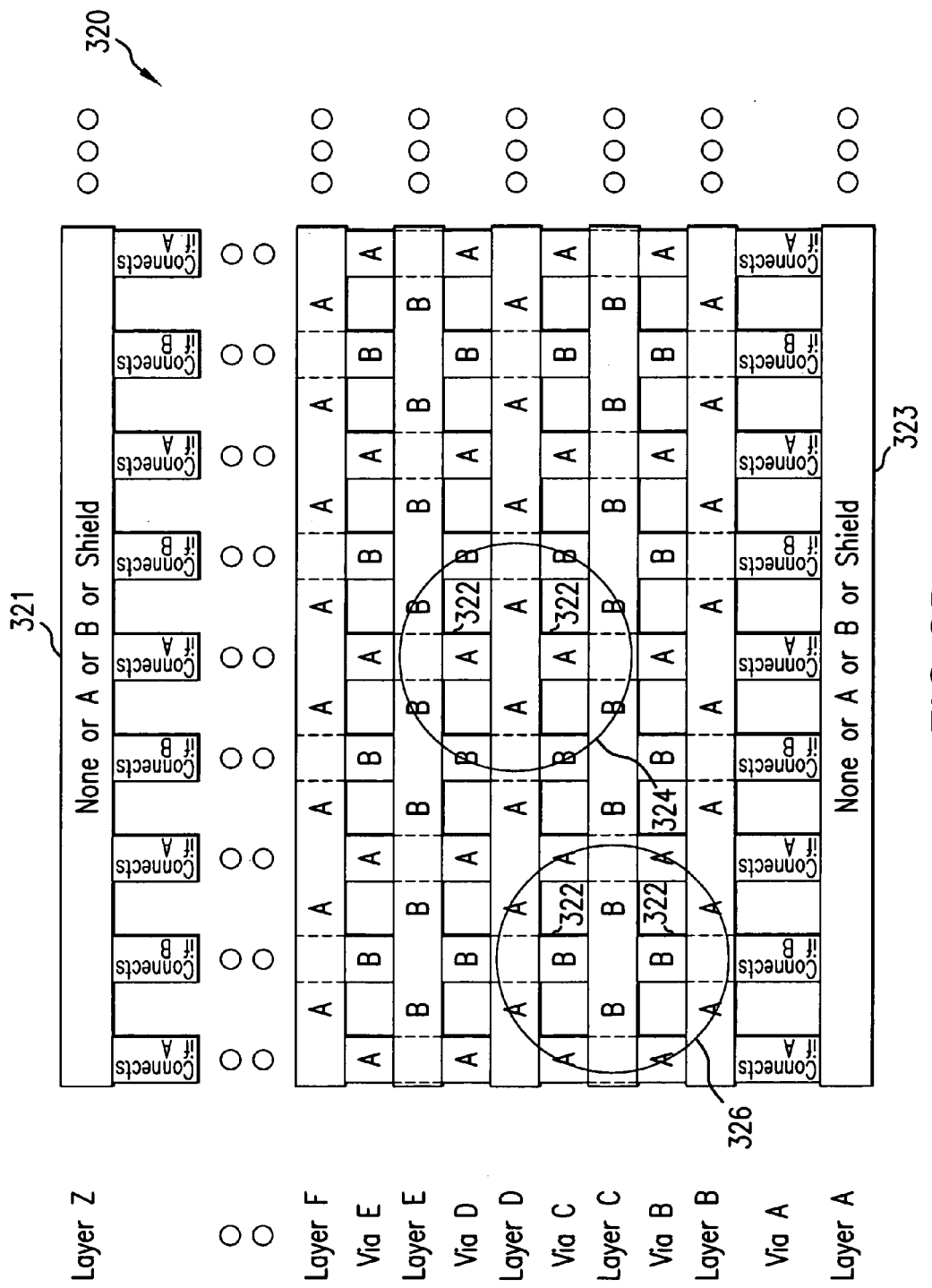
FIG. 3B is a schematic diagram depicting a cross sectional view (A—A) of the scalable integrated circuit loop-structure high density capacitor of FIG. 3A.

FIG. 3B is a schematic diagram depicting a cross sectional view (A—A) (see FIG. 3A) of the scalable integrated circuit loop-structure high density capacitor 320. As shown in FIG. 3B, capacitor 320 is scalable in that it can be formed using a selected number of metal layers such as, for example, metal layer 300, and the area of these metal layers can be varied. Optional shields 321 and/or 323 can be included as the top-most and/or bottom-most layers of capacitor 320, as well as optional side shields, to help reduce unwanted parasitic capacitance. Vias 322 couple one metal layer to another metal layer as illustrated, for example, in regions 324 and 326 of capacitor 320. In region 324, two vias 322 are shown coupling a metallization pattern 302 of metal layer D to a metallization pattern 304 in metal layer E and a metallization pattern 304 in metal layer C. In region 326, two vias 322 are shown coupling a metallization pattern 302 of metal layer C to a metallization pattern 304 in metal layer D and a metallization pattern 304 in metal layer B.

Figure 3C:
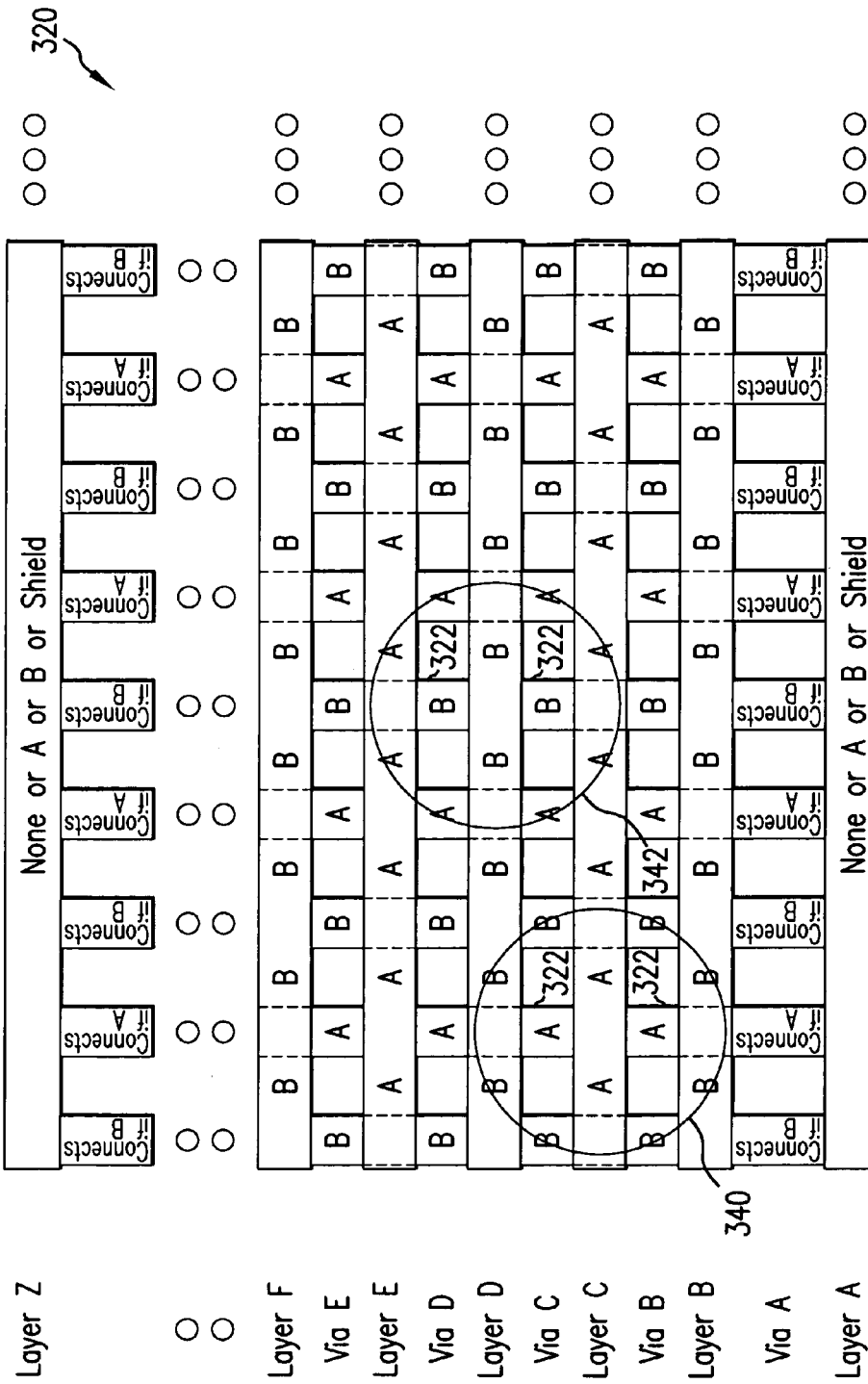
FIG. 3C is a schematic diagram depicting a cross sectional view (B—B) of the scalable integrated circuit loop-structure high density capacitor of FIG. 3A.

FIG. 3C is a schematic diagram depicting a second cross sectional view (B—B) (see FIG. 3A) of the scalable integrated circuit loop-structure high density capacitor 320. FIG. 3C further illustrates how vias 322 couple one metal layer of capacitor 320 to another metal layer. In region 340 of capacitor 320, two vias 322 are shown coupling a metallization pattern 302 of metal layer C to a metallization pattern 304 in metal layer D and a metallization pattern 304 in metal layer B. In region 342, two vias 322 are shown coupling a metallization pattern 302 of metal layer D to a metallization pattern 304 in metal layer E and a metallization pattern 304 in metal layer C.

Figure 3D:
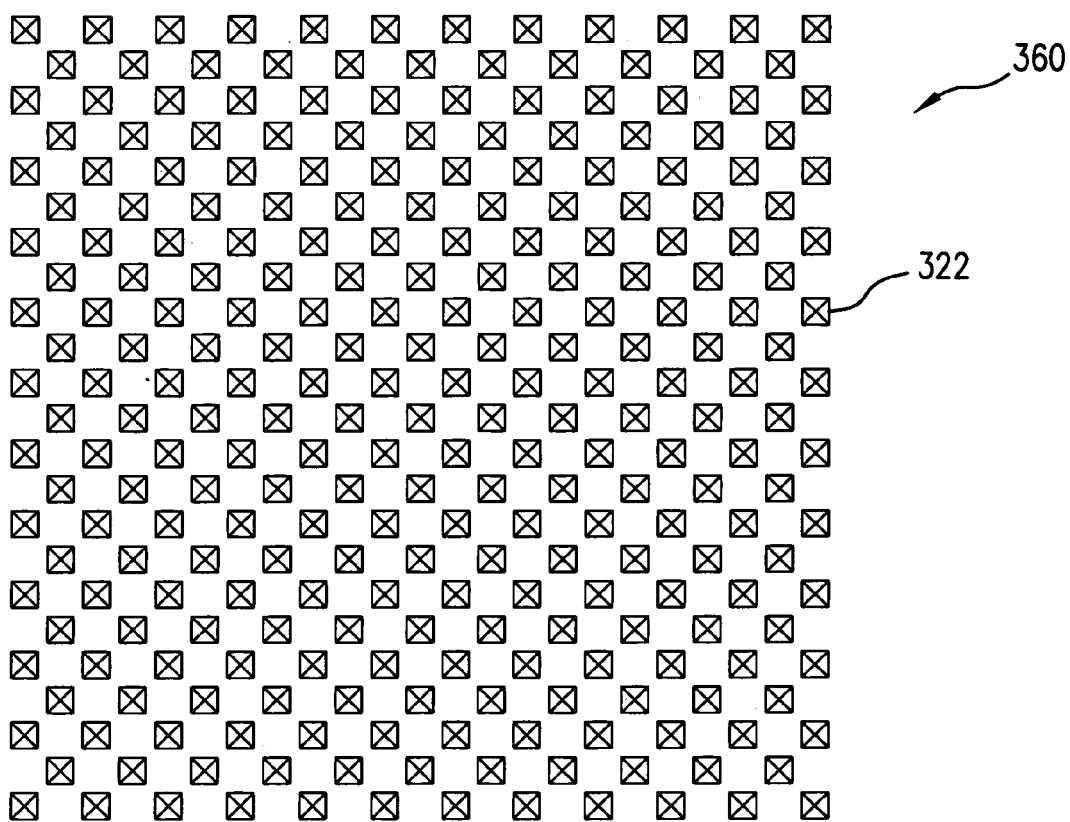
FIG. 3D is a schematic diagram depicting a top view of an example via layer of the scalable integrated circuit loop-structure high density capacitor of FIG. 3A.

FIG. 3D is a schematic diagram depicting a top view of an example via layer 360 of the scalable integrated circuit loop-structure high density capacitor 320. Via layer 360 includes a plurality of vias 322 used to couple adjacent metal layers of capacitor 320.

Figure 4A:
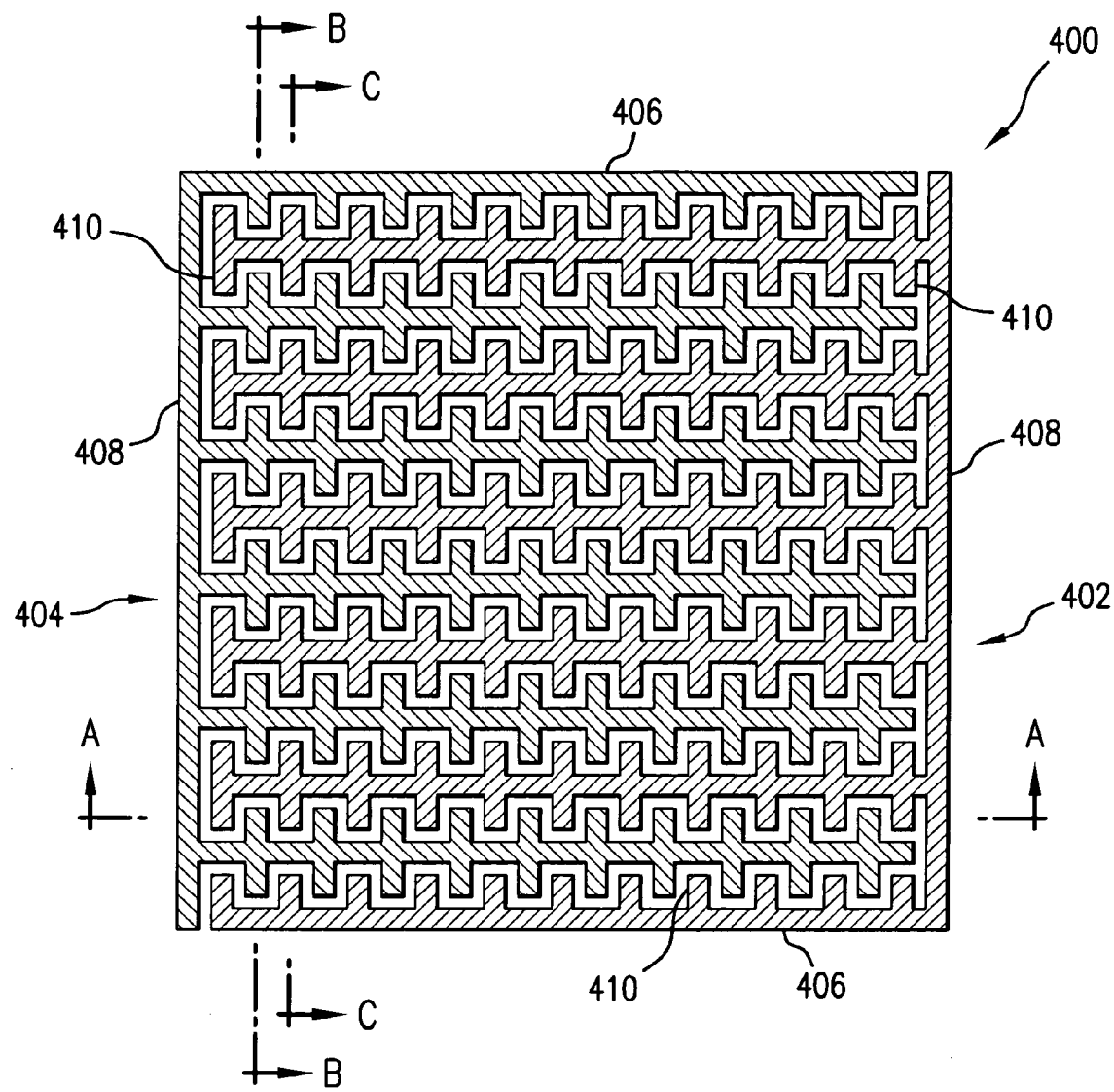
FIG. 4A is a schematic diagram depicting a top view of an example metal layer of a scalable integrated circuit weave-structure high density capacitor according to an embodiment of the present invention.

FIG. 4A is a schematic diagram depicting a top view of an example metal layer 400 of a scalable integrated circuit weave-structure high density capacitor 420 (see FIG. 4B) according to an embodiment of the present invention. As shown in FIG. 4A, metal layer 400 includes a metallization pattern 402 and a metallization pattern 404. The metallization patterns 402 and 404 each have a plurality of finger tracks 406 coupled approximately perpendicular to backbone tracks 408. The finger tracks 406 of metallization patterns 402 and 404 are interlaced as shown in FIG. 4A. Additionally, each finger track 406 has a plurality of spur tracks 410. The spur tracks 410 are coupled to two sides of a finger track 406, except for finger tracks at an end of a backbone track 408, as shown in FIG. 4A. The spur tracks 410 are coupled approximately perpendicular to a finger track 406 so that spur tracks 410 of adjacent finger tracks 406 interlace. By approximately perpendicular, it is meant that the finger tracks 406 and the spur tracks 410 are sufficiently perpendicular so that they can be interlaced as illustrated in FIG. 4A.

Figure 4B:
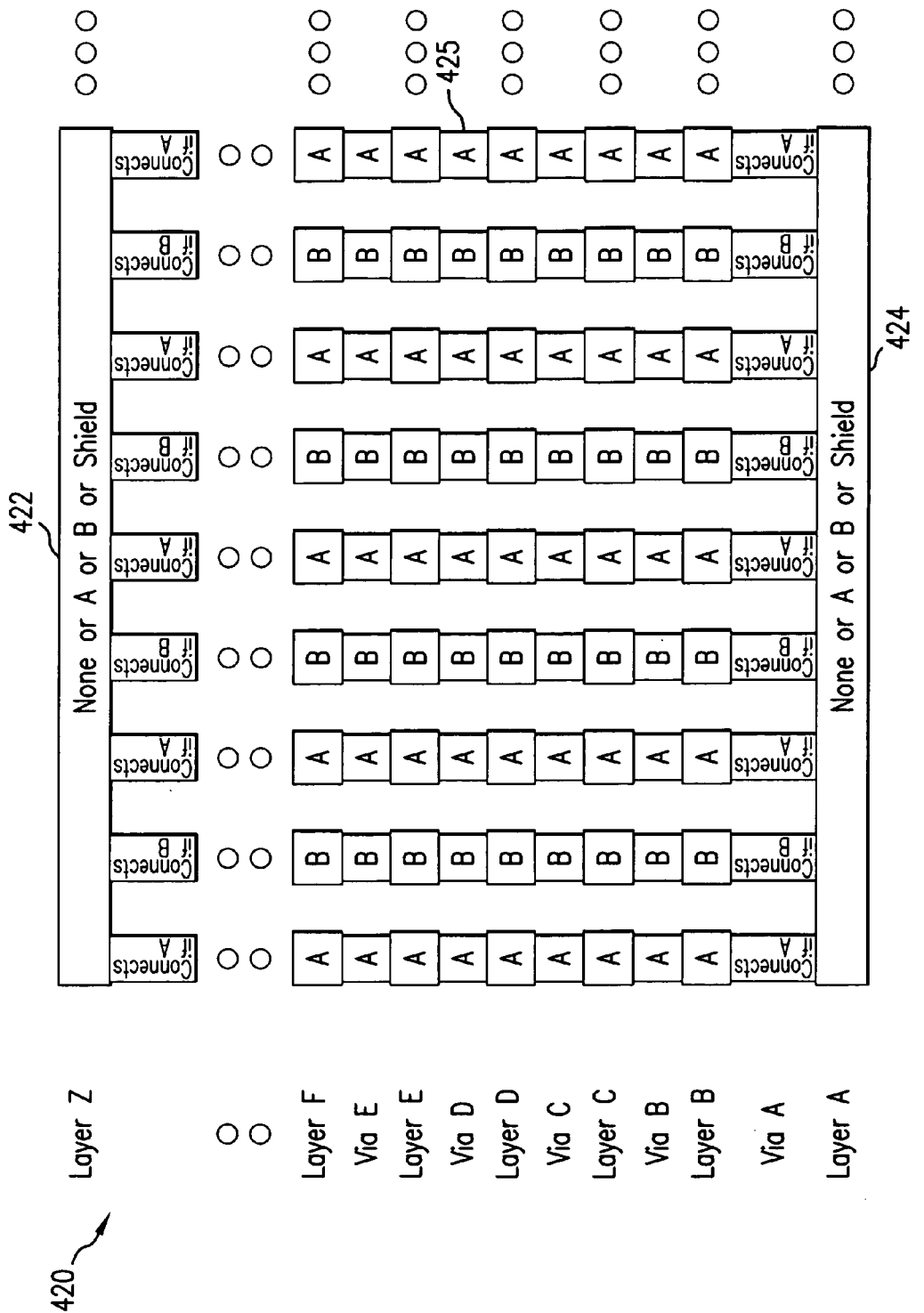
FIG. 4B is a schematic diagram depicting a cross sectional view (A—A) of the scalable integrated circuit weave-structure high density capacitor of FIG. 4A.

FIG. 4B is a schematic diagram depicting a cross sectional view (A—A) (see FIG. 4A) of the scalable integrated circuit weave-structure high density capacitor 420. As shown in FIG. 4B, capacitor 420 is scalable in that it can be formed using a selected number of metal layers such as, for example, metal layer 400, and the area of these metal layers can be varied. Optional shields 422 and/or 424 can be included as the top-most and/or bottom-most layers of capacitor 420, as well as optional side shields, to help reduce unwanted parasitic capacitance. Vias 425 couple one metal layer to another metal layer.

Figure 4C:
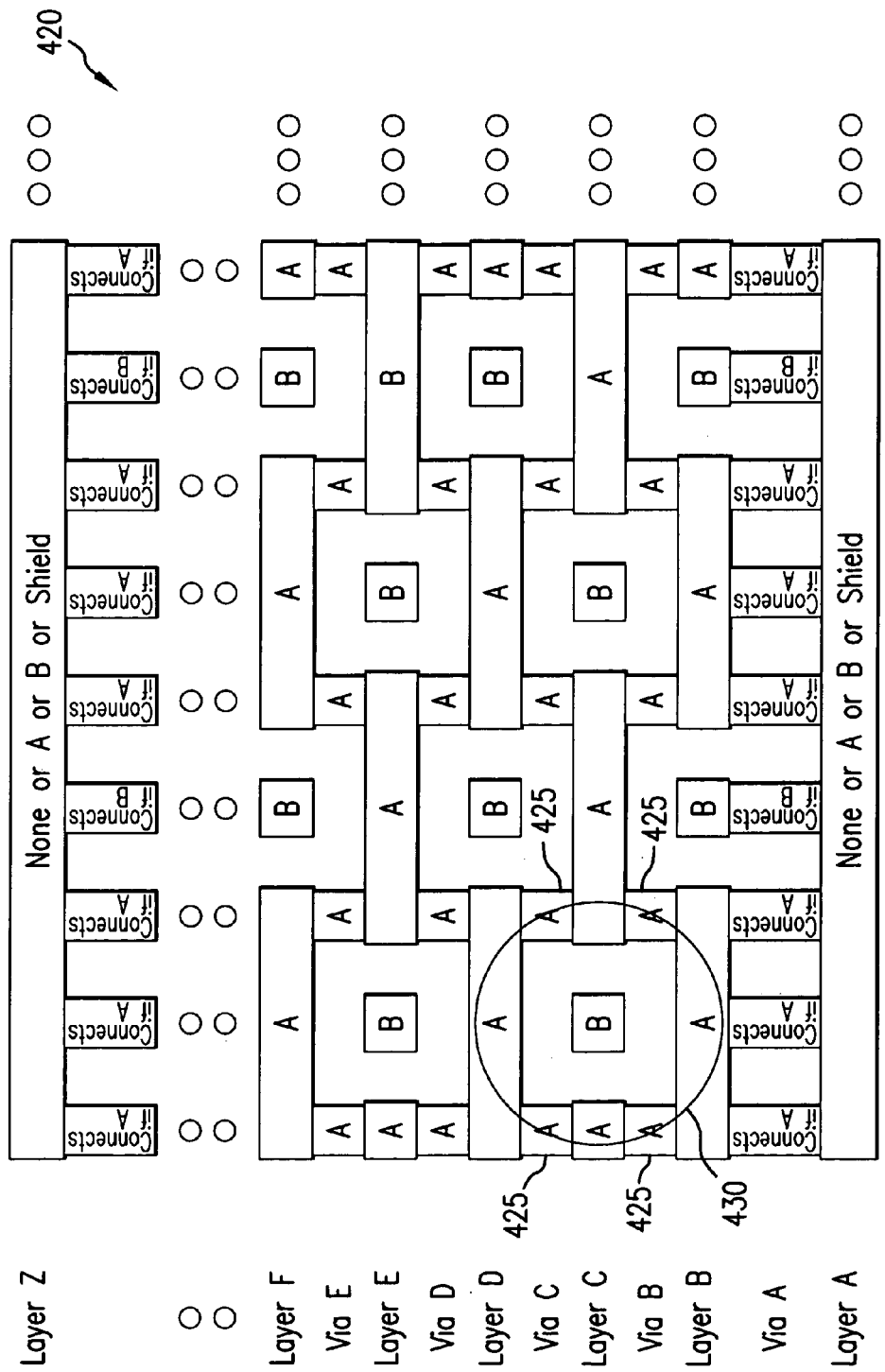
FIG. 4C is a schematic diagram depicting a cross sectional view (B—B) of the scalable integrated circuit weave-structure high density capacitor of FIG. 4A.

FIG. 4C is a schematic diagram depicting a cross sectional view (B—B) (see FIG. 4A) of the scalable integrated circuit weave-structure high density capacitor 420. FIG. 4C illustrates how vias 425 in a region 430 of capacitor 420 couple the spur tracks 410 of finger tracks 406 in one metal layer to the spur tracks 410 of the finger tracks 406 of other metal layers. Region 430 also illustrates how portions of capacitor 420 associated with a terminal A of capacitor 420 loop around a portion of capacitor 420 associated with a terminal B.

Figure 4D:
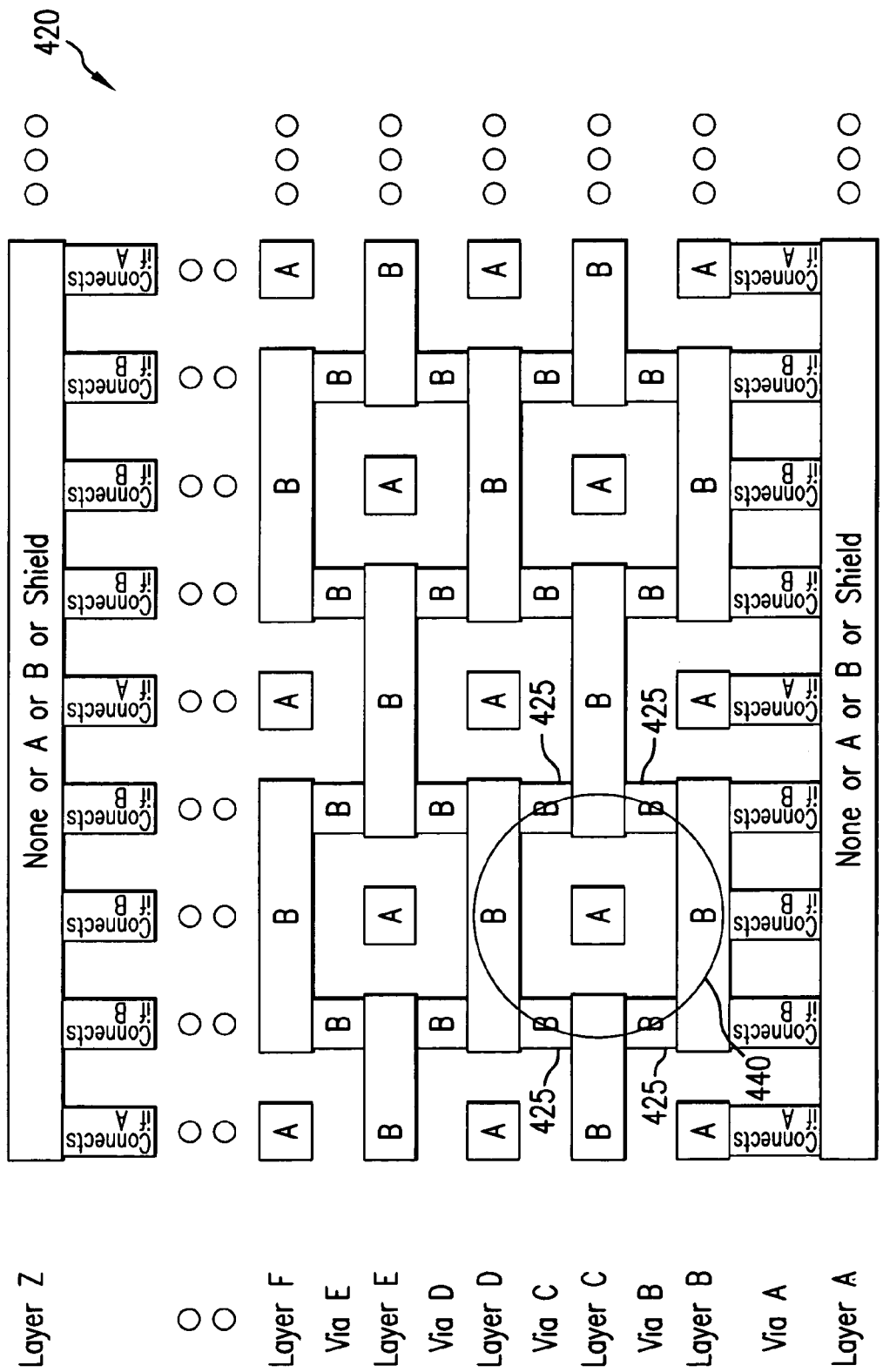
FIG. 4D is a schematic diagram depicting a cross sectional view (C—C) of the scalable integrated circuit weave-structure high density capacitor of FIG. 4A.

FIG. 4D is a schematic diagram depicting a cross sectional view (C—C) (see FIG. 4A) of the scalable integrated circuit weave-structure high density capacitor 420. FIG. 4D illustrates how in a region 440 of capacitor 420 portions of capacitor 420 associated with terminal B loop around a portion of capacitor 420 associated with terminal A.

Figure 4E:
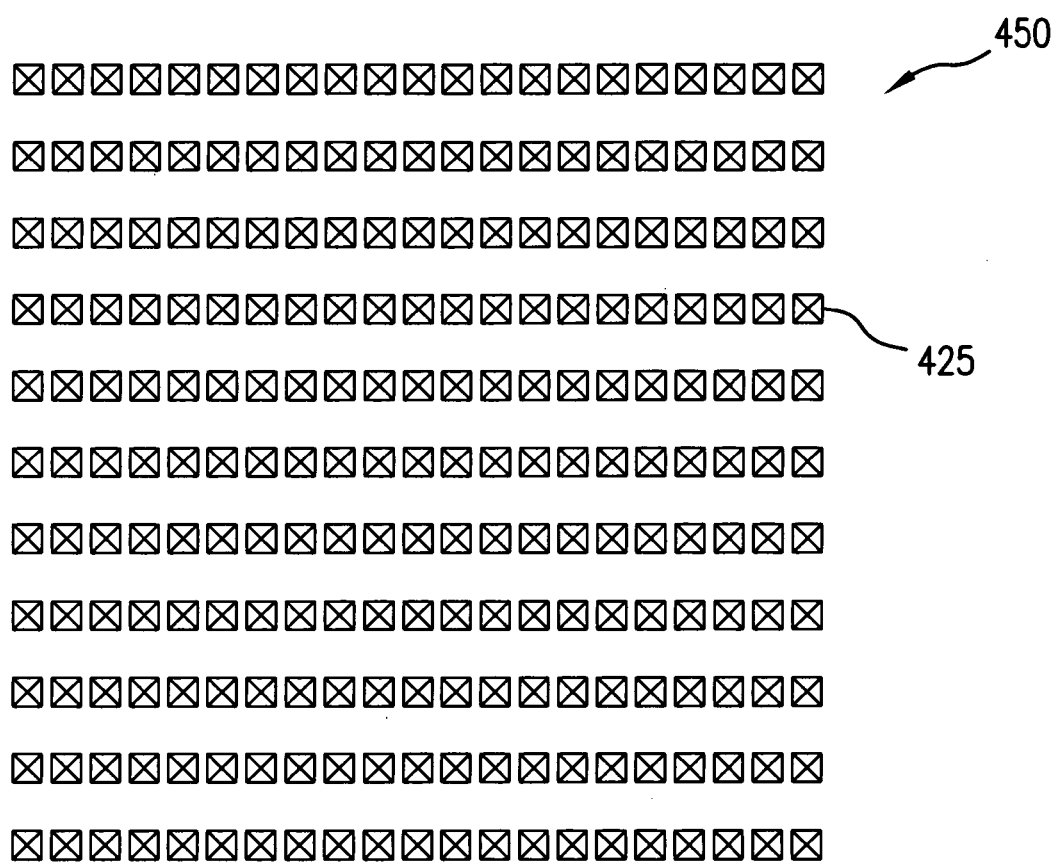
FIG. 4E is a schematic diagram depicting a top view of an example via layer of the scalable integrated circuit weave-structure high density capacitor of FIG. 4A.

FIG. 4E is a schematic diagram depicting a top view of an example via layer 450 of the scalable integrated circuit weave-structure high density capacitor 420. Via layer 450 includes a plurality of vias 425 used to couple adjacent metal layers of capacitor 420.

Figure 5A:
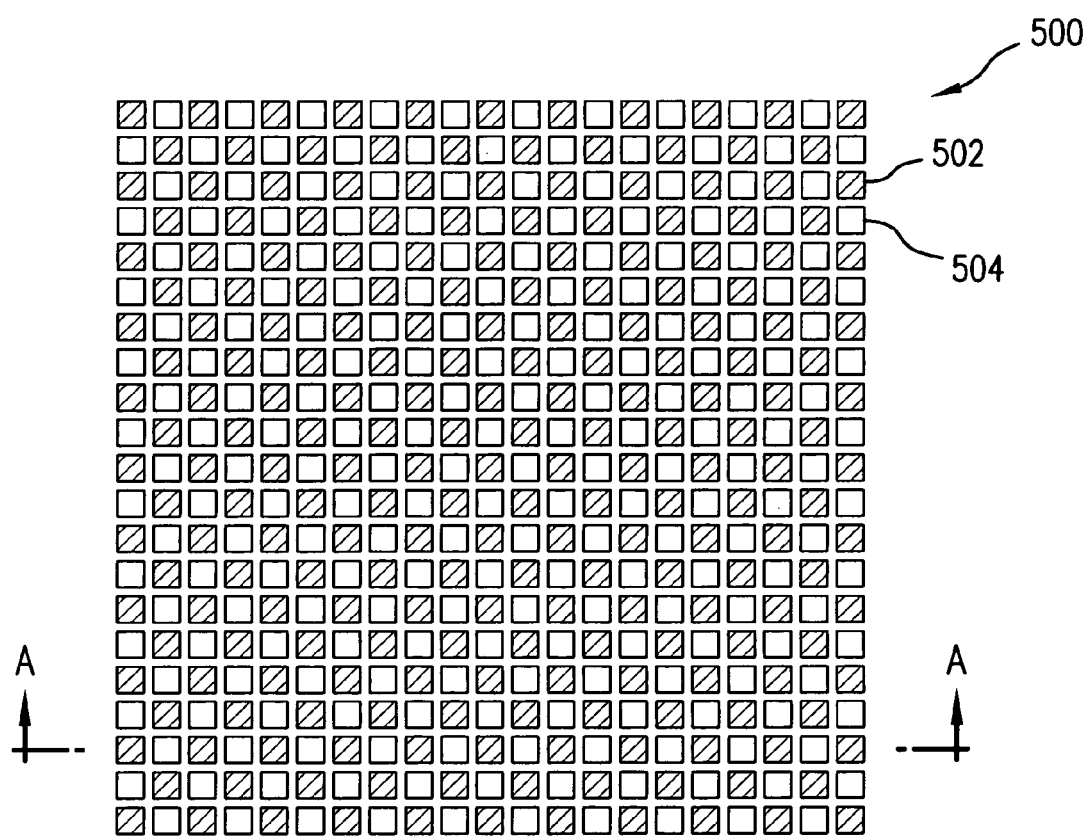
FIG. 5A is a schematic diagram depicting a top view of an example metal layer of a first scalable integrated circuit vertical-structure high density capacitor according to an embodiment of the present invention.

FIG. 5A is a schematic diagram depicting a top view of an example metal layer 500 of a first scalable integrated circuit vertical-structure high density capacitor 520 (see FIG. 5B) according to an embodiment of the present invention. Metal layer 500 includes a plurality of first metallization patterns 502 and a plurality of second metallization patterns 504 interspersed or arranged in a checkerboard pattern, as shown in FIG. 5A. The metallization patterns 502 and 504 are depicted as being square, but other shapes can be used.

Figure 5B:
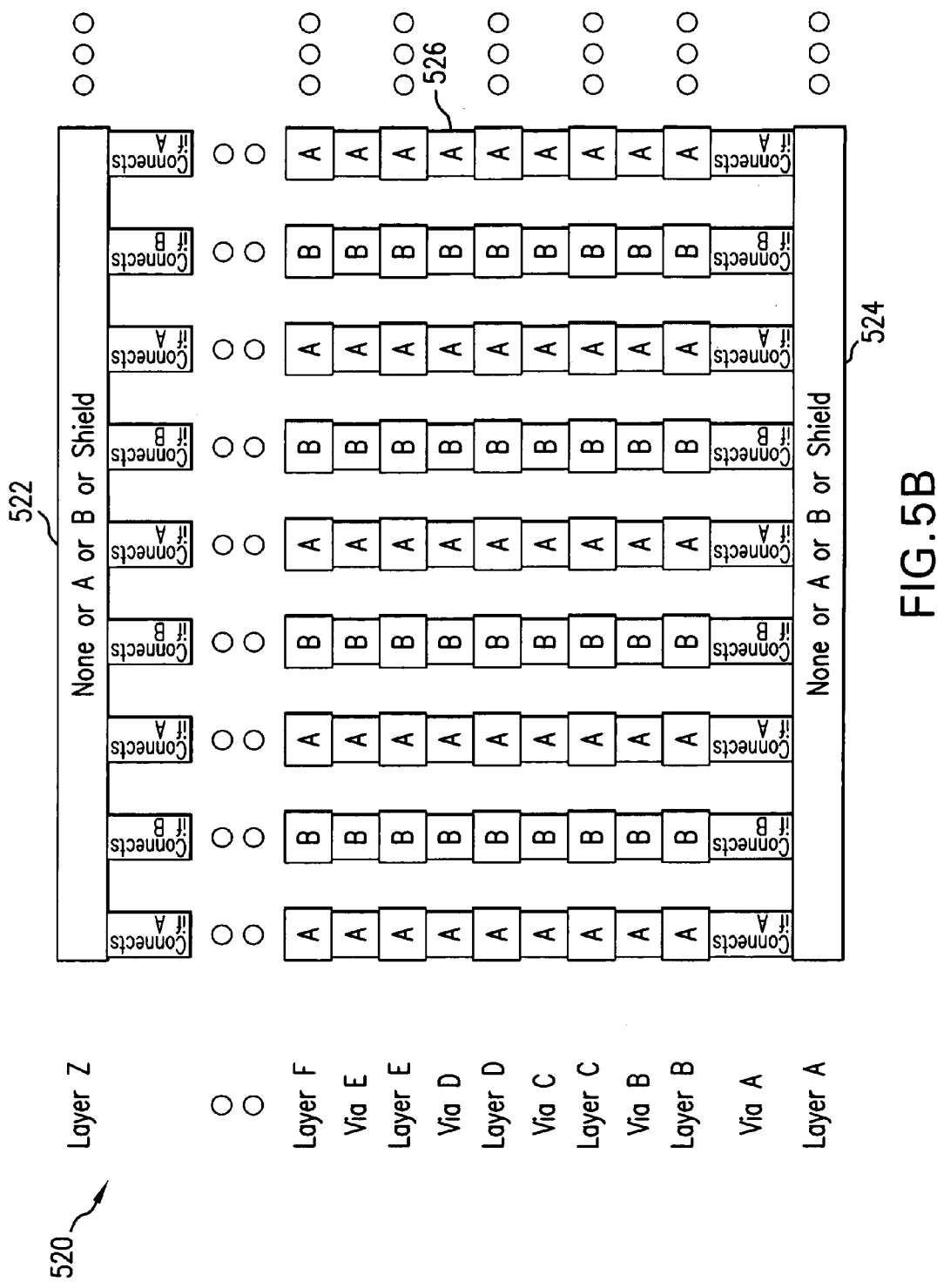
FIG. 5B is a schematic diagram depicting a cross sectional view (A—A) of the first scalable integrated circuit vertical-structure high density capacitor of FIG. 5A.

FIG. 5B is a schematic diagram depicting a cross sectional view (A—A) (see FIG. 5A) of the first scalable integrated circuit vertical-structure high density capacitor 520. As shown in FIG. 5B, capacitor 520 is scalable in that it can be formed using a selected number of metal layers such as, for example, metal layer 500, and the area of these metal layers can be varied. Optional shields 522 and/or 524 can be included as the top-most and/or bottom-most layers of capacitor 520, as well as optional side shields, to help reduce unwanted parasitic capacitance. Vias 526 couple one metal layer to another metal layer as illustrated. The portions of capacitor 520 labeled A are associated with an A terminal of capacitor 520, and the portions labeled B are associated with a B terminal of capacitor 520. Similar labeling is also used to identify portions of a capacitor associated with the A and/or B terminals of the capacitor in other figures (see for example FIG. 1B and FIG. 10B)

Figure 5C:
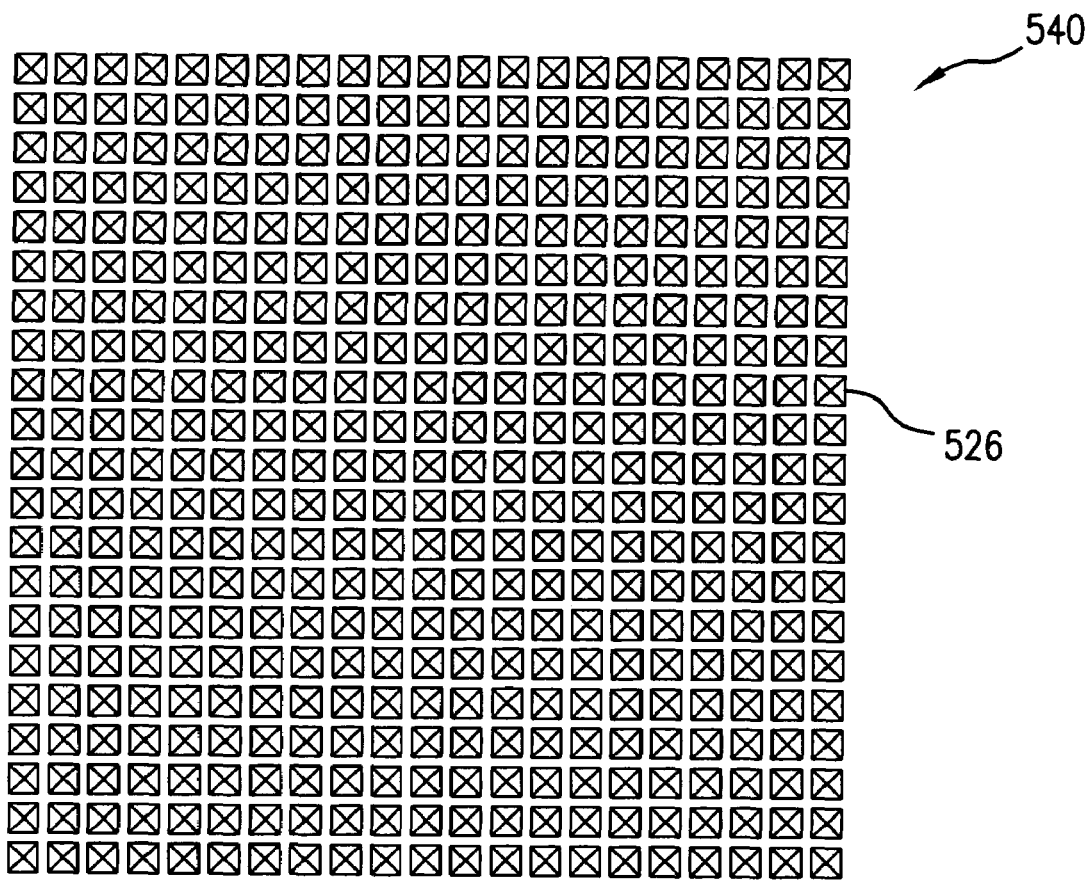
FIG. 5C is a schematic diagram depicting a top view of an example via layer of the first scalable integrated circuit vertical-structure high density capacitor of FIG. 5A.

FIG. 5C is a schematic diagram depicting a top view of an example via layer 540 of the first scalable integrated circuit vertical-structure high density capacitor 520. Via layer 540 includes a plurality of vias 526 used to couple adjacent metal layers of capacitor 520.

Figure 6A:
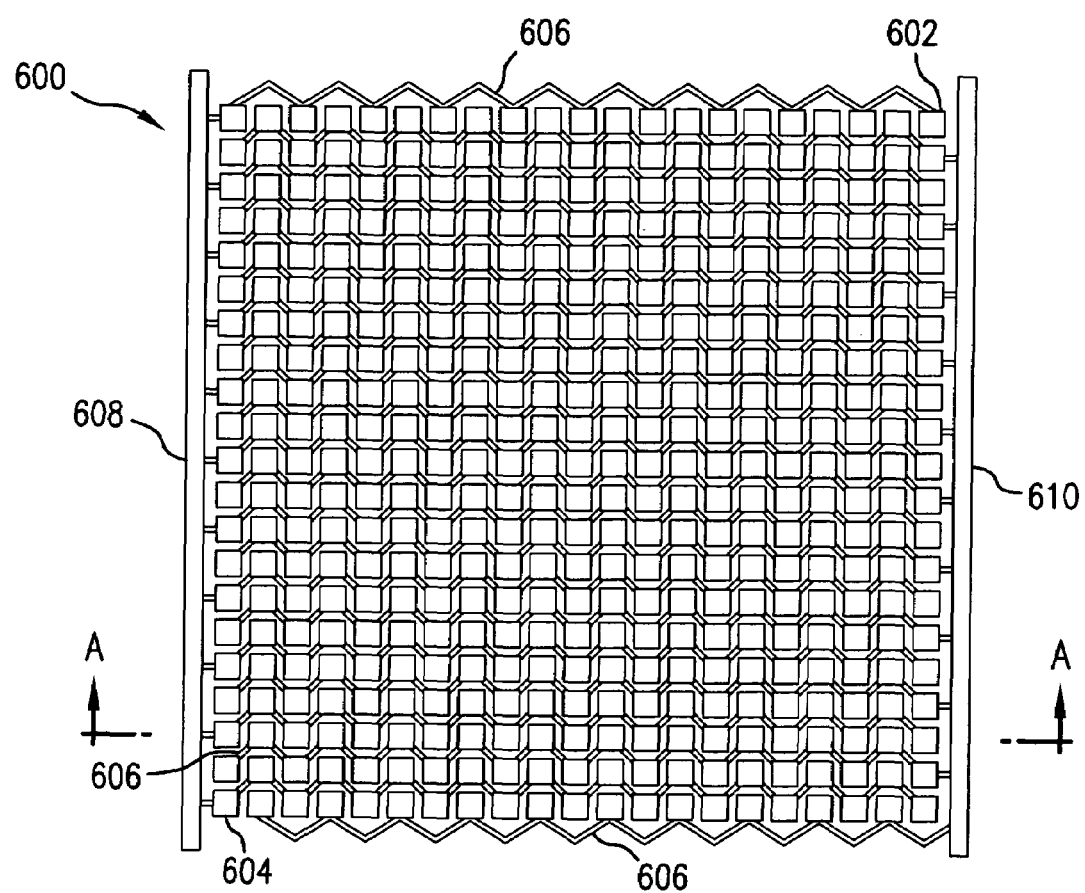
FIG. 6A is a schematic diagram depicting a top view of an example metal layer of a second scalable integrated circuit vertical-structure high density capacitor according to an embodiment of the present invention.

FIG. 6A is a schematic diagram depicting a top view of an example metal layer 600 of a second scalable integrated circuit vertical-structure high density capacitor 620 (see FIG. 6B) according to an embodiment of the present invention. Metal layer 600 includes a plurality of first metallization patterns 602 and a plurality of second metallization patterns 604 interspersed or arranged in a checkerboard pattern, similar to that shown in FIG. 5A. The metallization patterns 602 are coupled together and to a backbone track 608 by connecting tracks 606, as depicted in FIG. 6A. The metallization patterns 604 also are coupled together and to a backbone track 610 by connecting tracks 606. The metallization patterns 602 and 604 are shown as being square, but other shapes can be used.

Figure 6B:
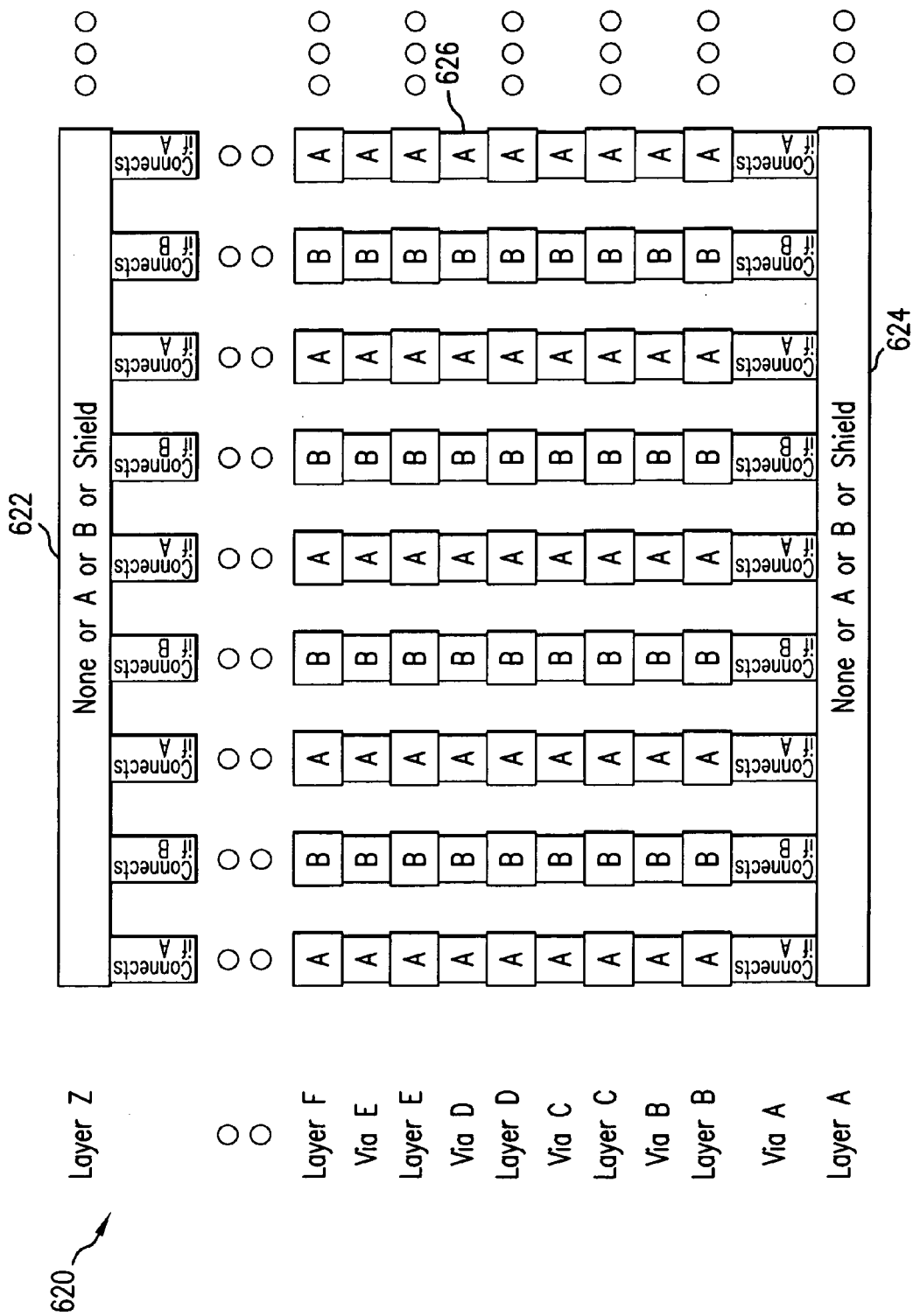
FIG. 6B is a schematic diagram depicting a cross sectional view (A—A) of the second scalable integrated circuit vertical-structure high density capacitor of FIG. 6A.

FIG. 6B is a schematic diagram depicting a cross sectional view (A—A) (see FIG. 6A) of the second scalable integrated circuit vertical-structure high density capacitor 620. As shown in FIG. 6B, capacitor 620 is scalable in that it can be formed using a selected number of metal layers such as, for example, metal layer 600, and the area of these metal layers can be varied. Optional shields 622 and/or 624 can be included as the top-most and/or bottom-most layers of capacitor 620, as well as optional side shields, to help reduce unwanted parasitic capacitance. Vias 626 couple one metal layer to another metal layer as illustrated in FIG. 6B. In one embodiment, the metallization patterns 602 and 604 are coupled such that vertically aligned metallization patterns of two adjacent metal layers belong to the same terminal of capacitor 620. In another embodiment, the metallization patterns 602 and 604 are coupled such that vertically aligned metallization patterns of two adjacent metal layers belong to different terminals of capacitor 620.

Figure 6C:
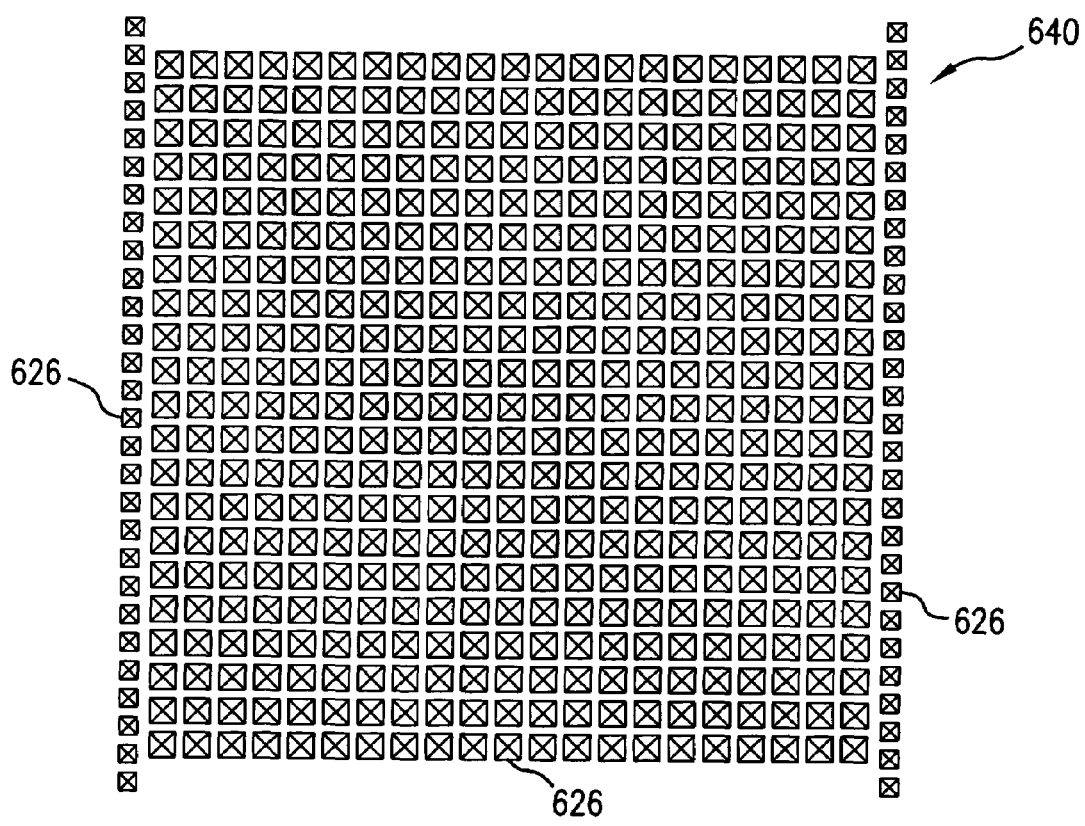
FIG. 6C is a schematic diagram depicting a top view of an example via layer of the second scalable integrated circuit vertical-structure high density capacitor of FIG. 6A.

FIG. 6C is a schematic diagram depicting a top view of an example via layer 640 of the second scalable integrated circuit vertical-structure high density capacitor 620. Via layer 640 includes a plurality of vias 626 used to couple adjacent metal layers of capacitor 620. As shown, the vias 626 couple both the metallization patterns 602 and 604 as well as the backbone tracks 608 and 610.

Figure 7A:
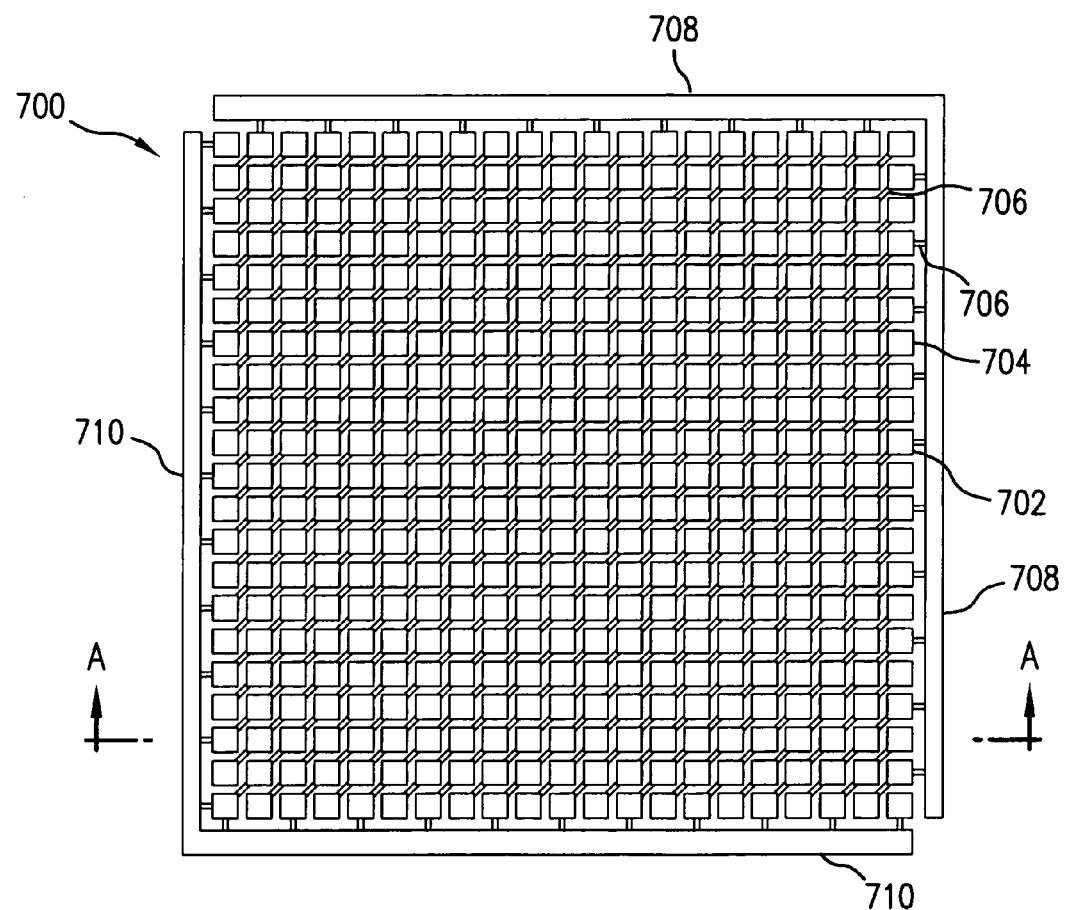
FIG. 7A is a schematic diagram depicting a top view of an example metal layer of a third scalable integrated circuit vertical-structure high density capacitor according to an embodiment of the present invention.

FIG. 7A is a schematic diagram depicting a top view of an example metal layer 700 of a third scalable integrated circuit vertical-structure high density capacitor 720 (see FIG. 7B) according to an embodiment of the present invention. Metal layer 700 includes a plurality of first metallization patterns 702 and a plurality of second metallization patterns 704 interspersed or arranged in a checkerboard pattern, similar to that shown in FIG. 5A. The metallization patterns 702 are coupled together and to a backbone track 708 by connecting tracks 706, as depicted in FIG. 7A. The metallization patterns 704 also are coupled together and to a backbone track 710 by connecting tracks 706. The metallization patterns 702 and 704 are shown as being square, but other shapes also can be used.

Figure 7B:
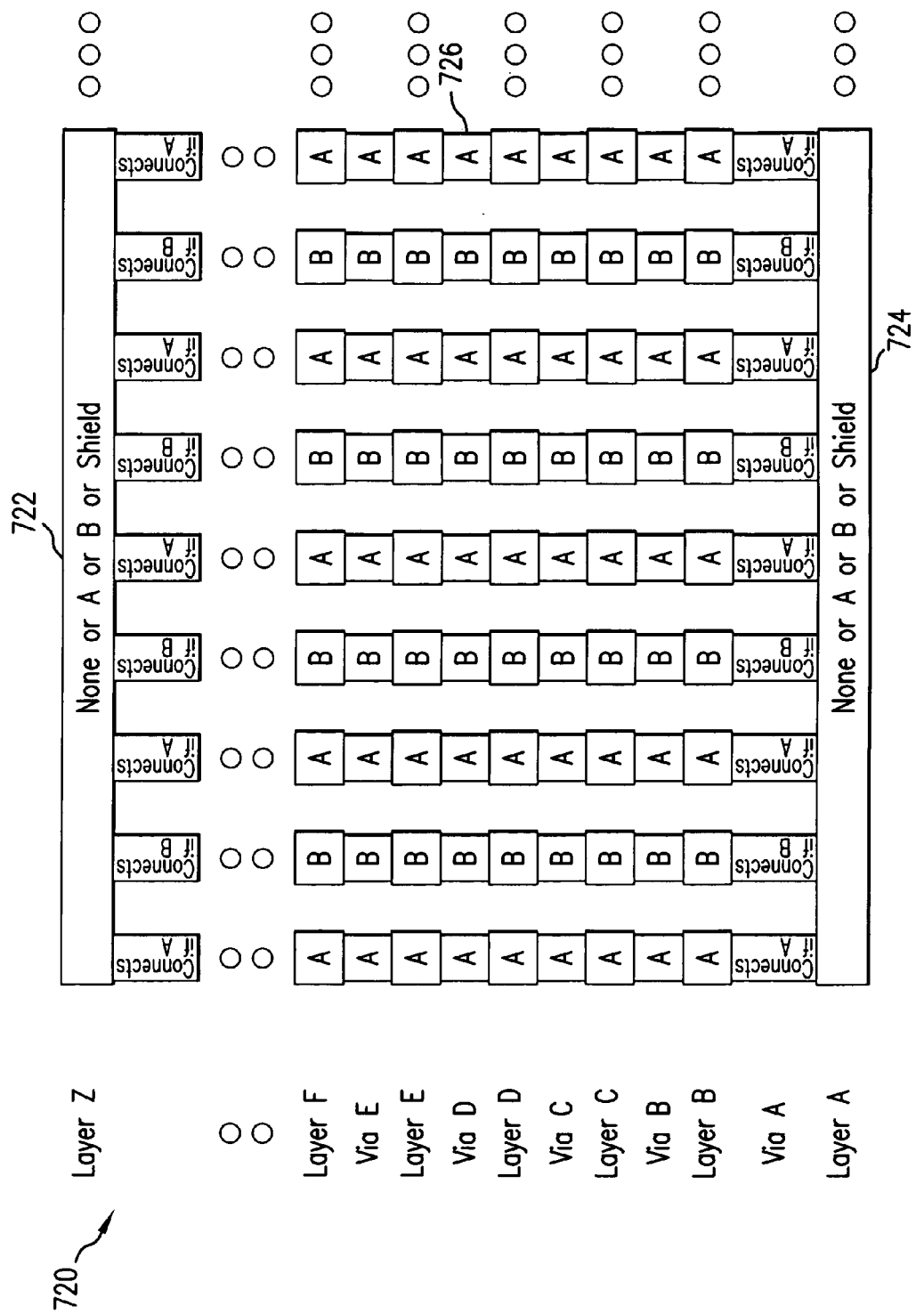
FIG. 7B is a schematic diagram depicting a cross sectional view (A—A) of the third scalable integrated circuit vertical-structure high density capacitor of FIG. 7A.

FIG. 7B is a schematic diagram depicting a cross sectional view (A—A) (see FIG. 7A) of the third scalable integrated circuit vertical-structure high density capacitor 720. As shown in FIG. 7B, capacitor 720 is scalable in that it can be formed using a selected number of metal layers such as, for example, metal layer 700, and the area of these metal layers can be varied. Optional shields 722 and/or 724 can be included as the top-most and/or bottom-most layers of capacitor 720, as well as optional side shields, to help reduce unwanted parasitic capacitance. Vias 726 couple one metal layer to another metal layer as illustrated in FIG. 7B.

Figure 7C:
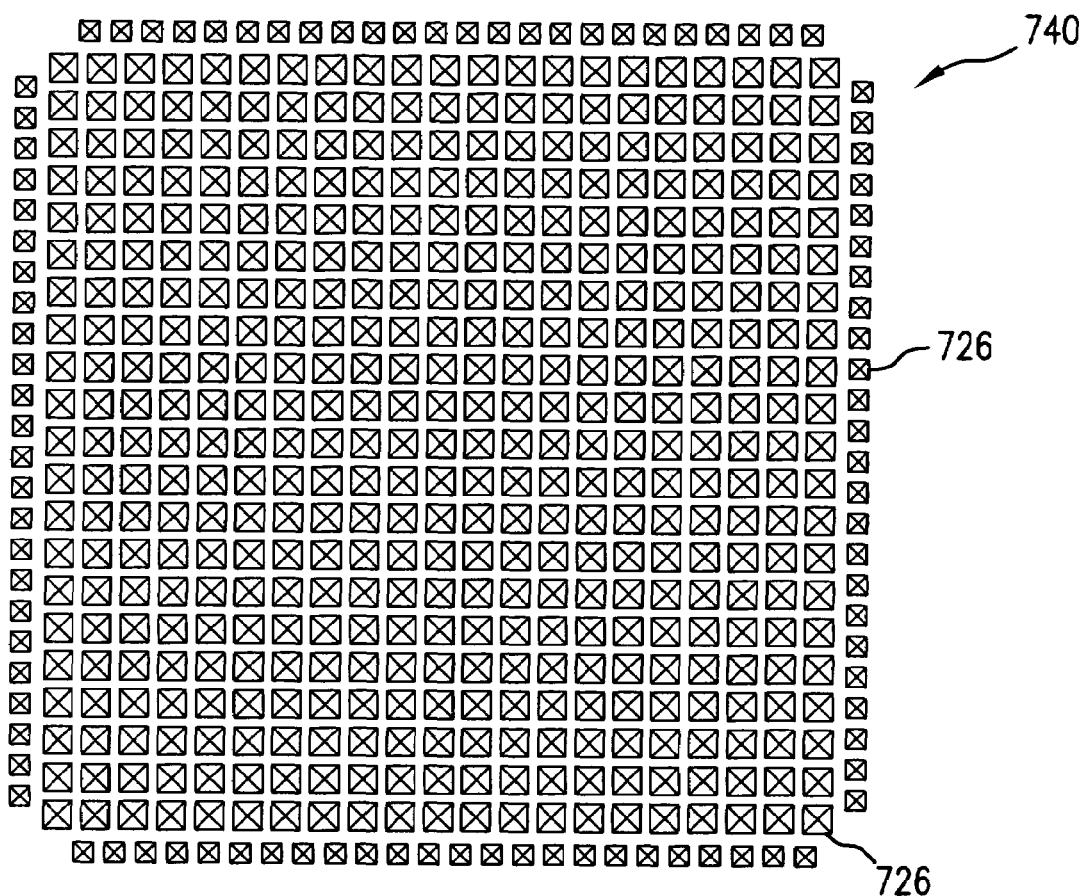
FIG. 7C is a schematic diagram depicting a top view of an example via layer of the third scalable integrated circuit vertical-structure high density capacitor of FIG. 7A.

FIG. 7C is a schematic diagram depicting a top view of an example via layer 740 of the third scalable integrated circuit vertical-structure high density capacitor 720. Via layer 740 includes a plurality of vias 726 used to couple adjacent metal layers of capacitor 720. As shown, the vias 726 couple both the metallization patterns 702 and 704 as well as the backbone tracks 708 and 710.

Figure 8A:
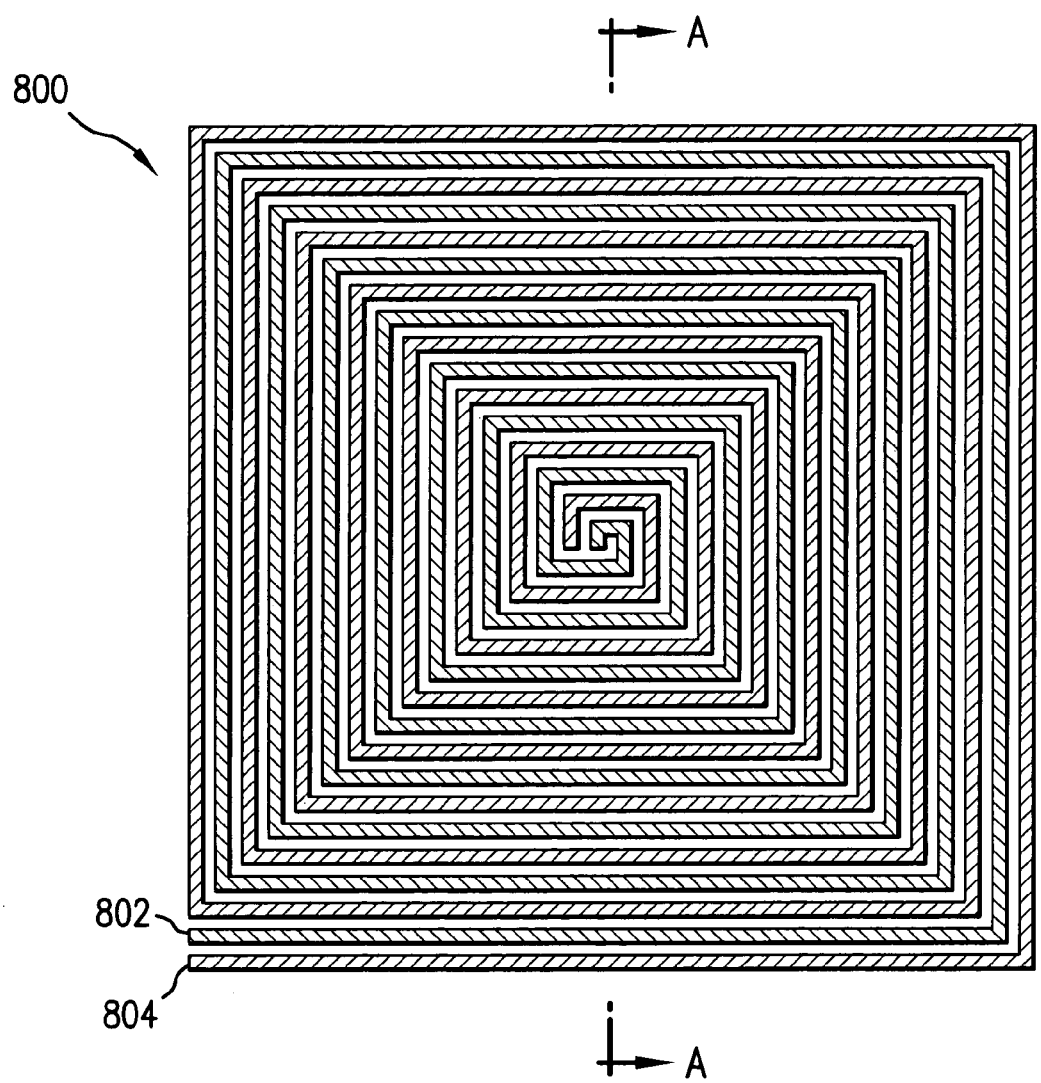
FIG. 8A is a schematic diagram depicting a top view of an example metal layer of a first scalable integrated circuit spiral-structure high density capacitor according to an embodiment of the present invention.

FIG. 8A is a schematic diagram depicting a top view of an example metal layer 800 of a first scalable integrated circuit spiral-structure high density capacitor 820 (see FIG. 8B) according to an embodiment of the present invention. Metal layer 800 includes a first metallization pattern 802 and a second metallization pattern 804. The metallization patterns 802 and 804 are interleaved with one another in a spiral arrangement as depicted in FIG. 8A.

Figure 8B:
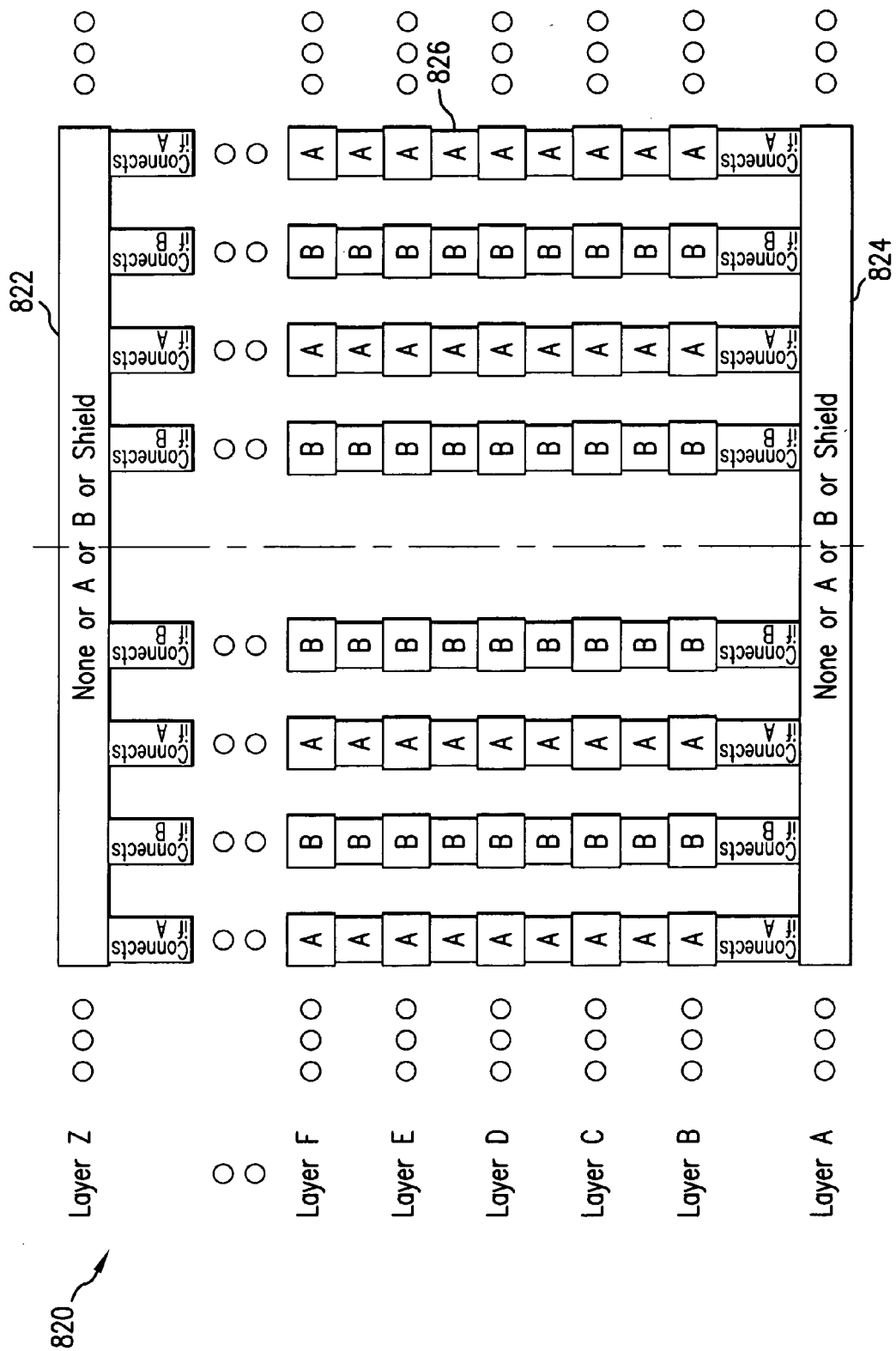
FIG. 8B is a schematic diagram depicting a cross sectional view (A—A) of the first scalable integrated circuit spiral-structure high density capacitor of FIG. 8A.

FIG. 8B is a schematic diagram depicting a cross sectional view (A—A) (see FIG. 8A) of the first scalable integrated circuit spiral-structure high density capacitor 820. As shown in FIG. 8B, capacitor 820 is scalable in that it can be formed using a selected number of metal layers such as, for example, metal layer 800, and the area of these metal layers can be varied. Optional shields 822 and/or 824 can be included as the top-most and/or bottom-most layers of capacitor 820, as well as optional side shields, to help reduce unwanted parasitic capacitance. Vias 826 couple one metal layer to another metal layer as illustrated in FIG. 8B. The portions of capacitor 820 labeled A are associated with an A terminal of capacitor 820, and the portions labeled B are associated with a B terminal of capacitor 820.

Figure 8C:
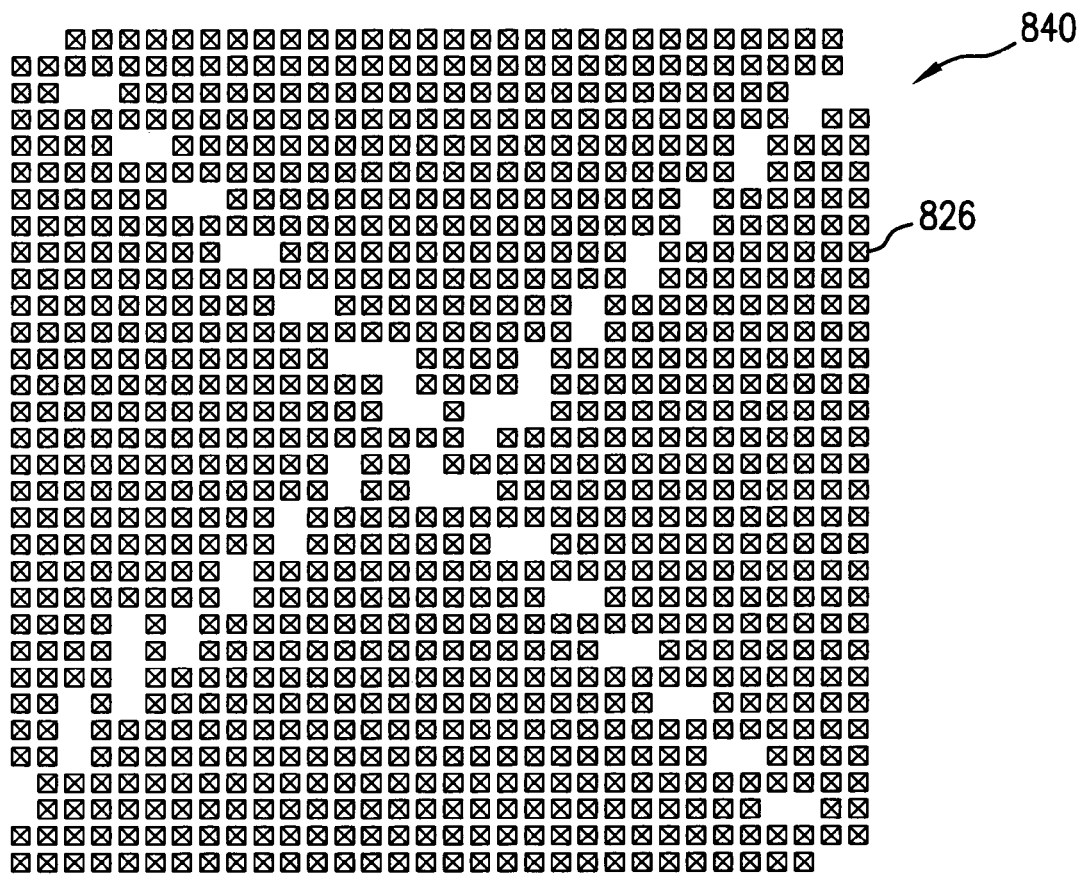
FIG. 8C is a schematic diagram depicting a top view of an example via layer of the first scalable integrated circuit spiral-structure high density capacitor of FIG. 8A.

FIG. 8C is a schematic diagram depicting a top view of an example via layer 840 of the first scalable integrated circuit spiral-structure high density capacitor 820. Via layer 840 includes a plurality of vias 826 used to couple adjacent metal layers of capacitor 820. The number of vias shown in FIG. 8C is exemplary, as is the case for the other via layer figures described herein.

Figure 9A:
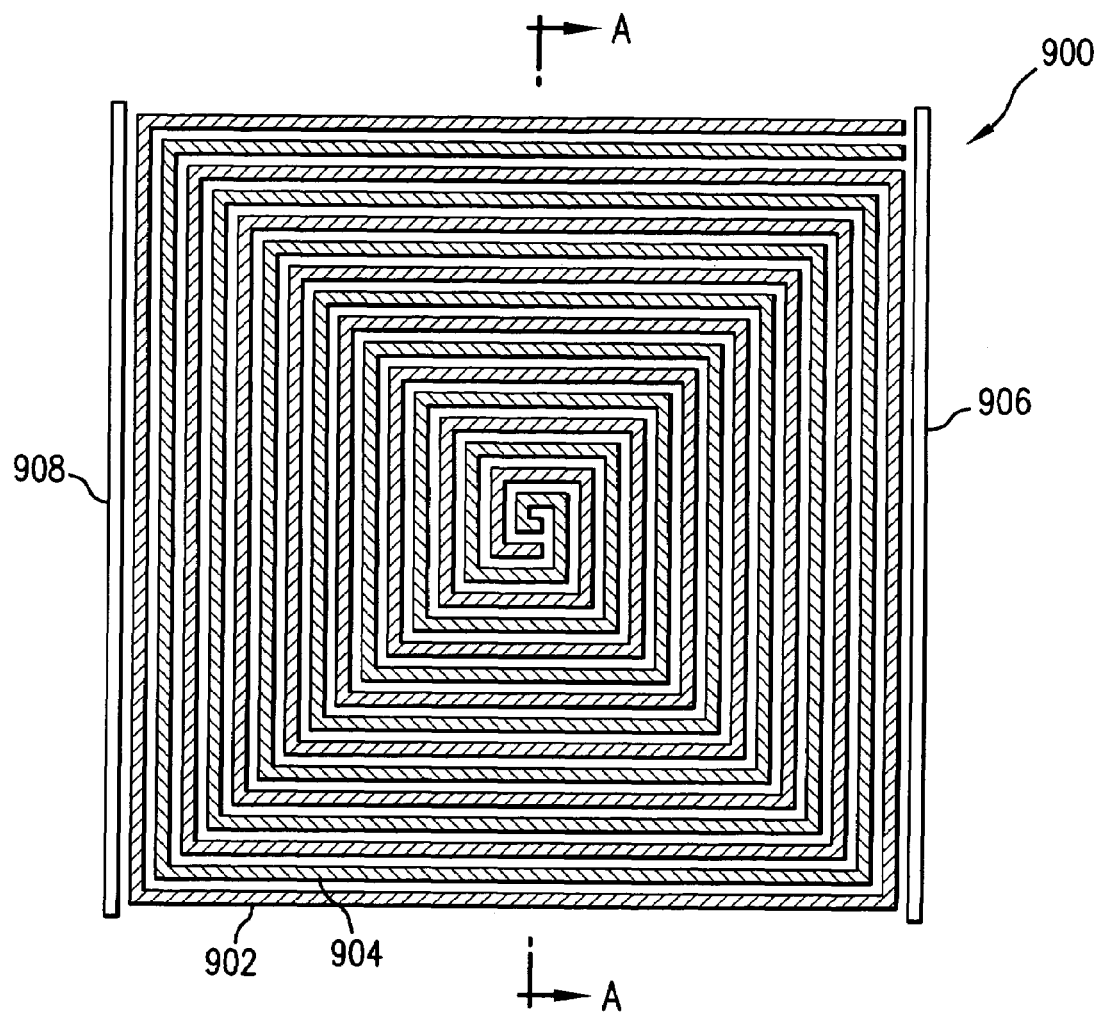
FIG. 9A is a schematic diagram depicting a top view of a first example metal layer of a second scalable integrated circuit spiral-structure high density capacitor according to an embodiment of the present invention.

FIG. 9A is a schematic diagram depicting a top view of an example metal layer 900 of a second scalable integrated circuit spiral-structure high density capacitor 920 (see FIG. 9B) according to an embodiment of the present invention. Metal layer 900 includes a first metallization pattern 902 and a second metallization pattern 904. The metallization patterns 902 and 904 are interleaved with one another in a spiral arrangement as depicted in FIG. 9A. In addition, metal layer 900 includes two border tracks 906 and 908 located proximate to two sides of the interleaved metallization patterns 902 and 904.

Figure 9B:
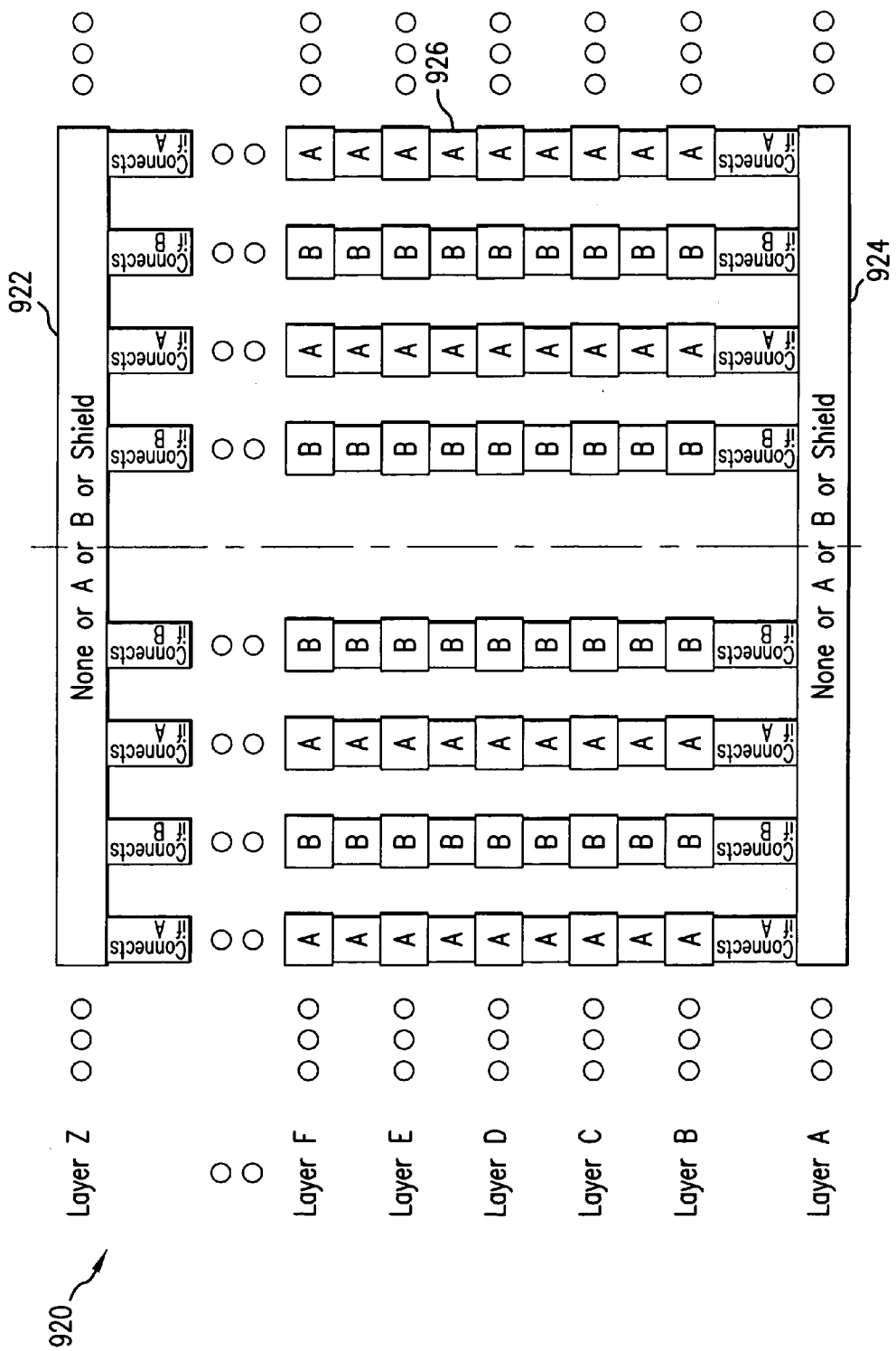
FIG. 9B is a schematic diagram depicting a cross sectional view (A—A) of the second scalable integrated circuit spiral-structure high density capacitor of FIG. 9A.

FIG. 9B is a schematic diagram depicting a cross sectional view (A—A) (see FIG. 9A) of the second scalable integrated circuit spiral-structure high density capacitor 920. As shown in FIG. 9B, capacitor 920 is scalable in that it can be formed using a selected number of metal layers such as, for example, metal layer 900, and the area of these metal layers can be varied. Optional shields 922 and/or 924 can be included as the top-most and/or bottom-most layers of capacitor 920, as well as optional side shields, to help reduce unwanted parasitic capacitance. Vias 926 couple one metal layer to another metal layer as illustrated in FIG. 9B.

Figure 9C:
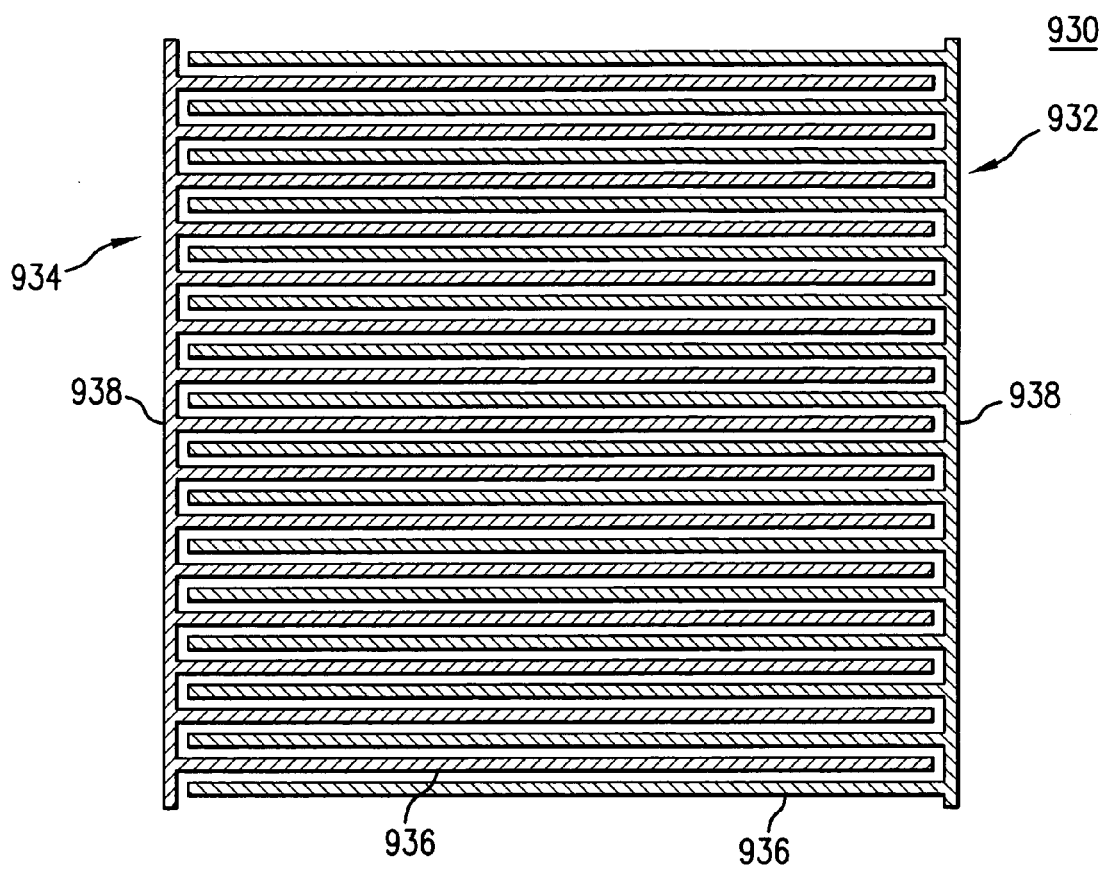
FIG. 9C is a schematic diagram depicting a top view of a second example metal layer for the second scalable integrated circuit spiral-structure high density capacitor of FIG. 9A.

FIG. 9C is a schematic diagram depicting a top view of an example metal layer 930 for the second scalable integrated circuit spiral-structure high density capacitor 920. Metal layer 930 has a cross bar shape that can be used to connect the inner parts of capacitor 920. Metal layer 930 also can be used, for example, for the shield 922 or 924. Alternatively, optional shields 922 and 924 can be formed using a solid shape, like a plate.

As shown in FIG. 9C, metal layer 930 includes two metallization patterns 932 and 934. Metallization pattern 932 has a plurality of finger tracks 936 coupled approximately perpendicular to a backbone track 938. Similarly, metallization pattern 934 has a plurality of finger tracks 936 coupled approximately perpendicular to a second backbone track 938. The fingers 936 of metallization patterns 932 and 934 are interlaced as shown in FIG. 9C. The finger tracks 936 increase the capacitance. The metallization patterns 932 and 934 can be formed using any conducting metal. In an embodiment, copper or aluminum is used to form the metallization patterns 932 and 934, but the invention is not limited to these metals.

Presently, in some processes, the minimum wire width of higher metal layers may not be the same as for lower metal layers, which may complicate forming a spiral of the same dimensions in each metal layer. In such cases, metal layer 930 can be used for metal layers having a relatively large minimum width. In general, scalable high density capacitors according to the present invention can be formed using combinations of the structures described herein. For example, the structure of capacitor 920 resembles a combination of the structures of capacitors 150 and 820.

Figure 9D:
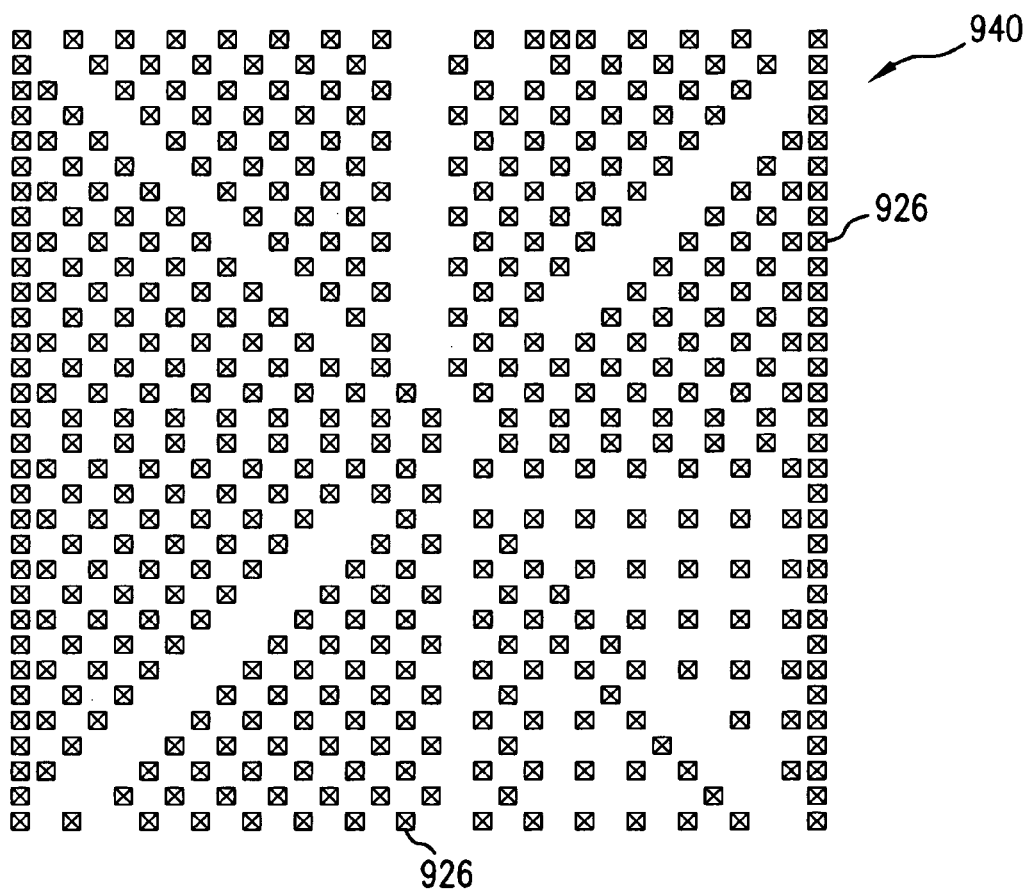
FIG. 9D is a schematic diagram depicting a top view of an example via layer of the second scalable integrated circuit spiral-structure high density capacitor of FIG. 9A.

FIG. 9D is a schematic diagram depicting a top view of an example via layer 940 of the second scalable integrated circuit spiral-structure high density capacitor 920. Via layer 940 includes a plurality of vias 926 used to couple adjacent metal layers of capacitor 920. The vias 926 couple both the metallization patterns 932 and 934 and the border tracks 908.

Figure 10A:
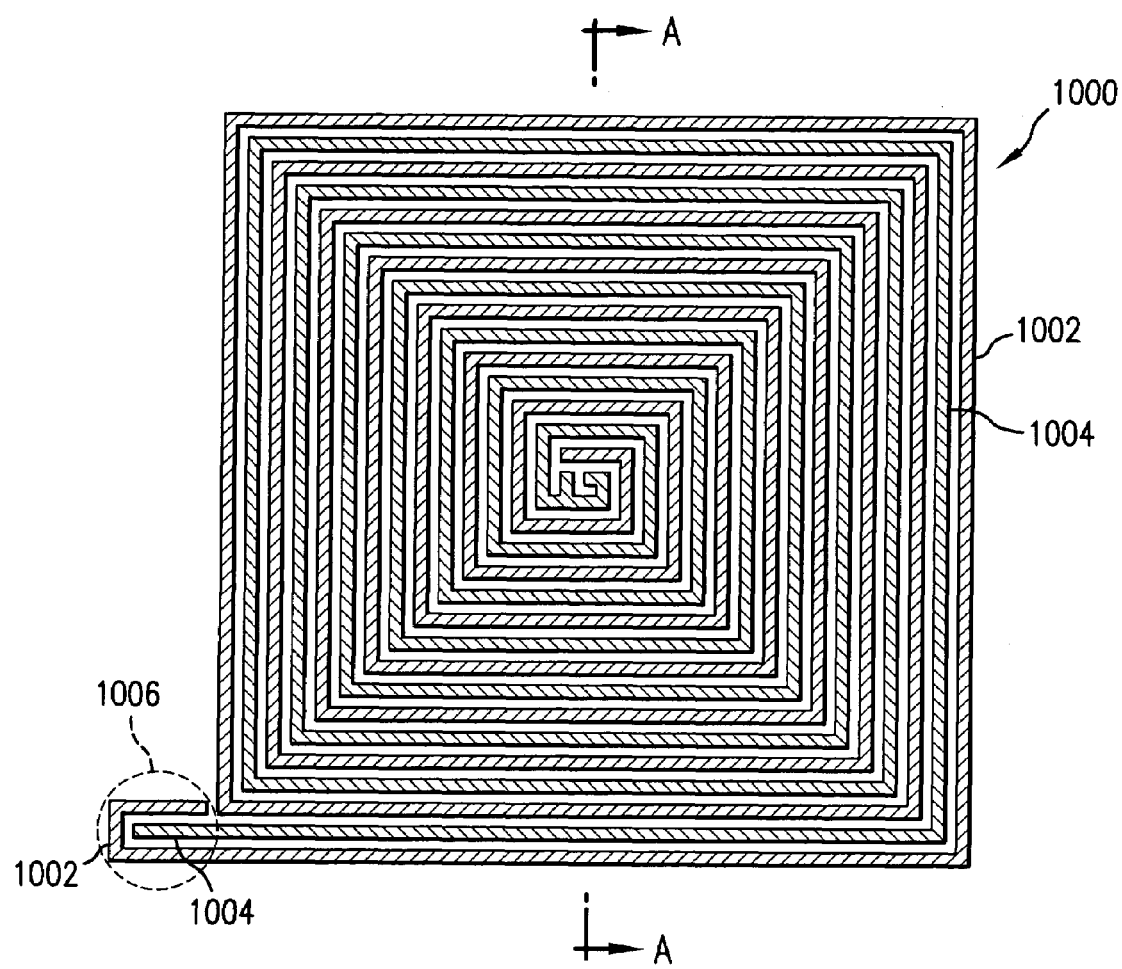
FIG. 10A is a schematic diagram depicting a top view of a first example metal layer of a third scalable integrated circuit spiral-structure high density capacitor according to an embodiment of the present invention.

FIG. 10A is a schematic diagram depicting a top view of a first example metal layer 1000 of a third scalable integrated circuit spiral-structure high density capacitor 1020 (see FIG. 10B) according to an embodiment of the present invention. Metal layer 1000 includes a first metallization pattern 1002 and a second metallization pattern 1004. The metallization patterns 1002 and 1004 are interleaved with one another in a spiral arrangement as depicted in FIG. 10A. In region 1006 of capacitor 1020, a end of metallization pattern 1002 optionally wraps around an end of metallization pattern 1004, as shown in FIG. 10A.

Figure 10B:
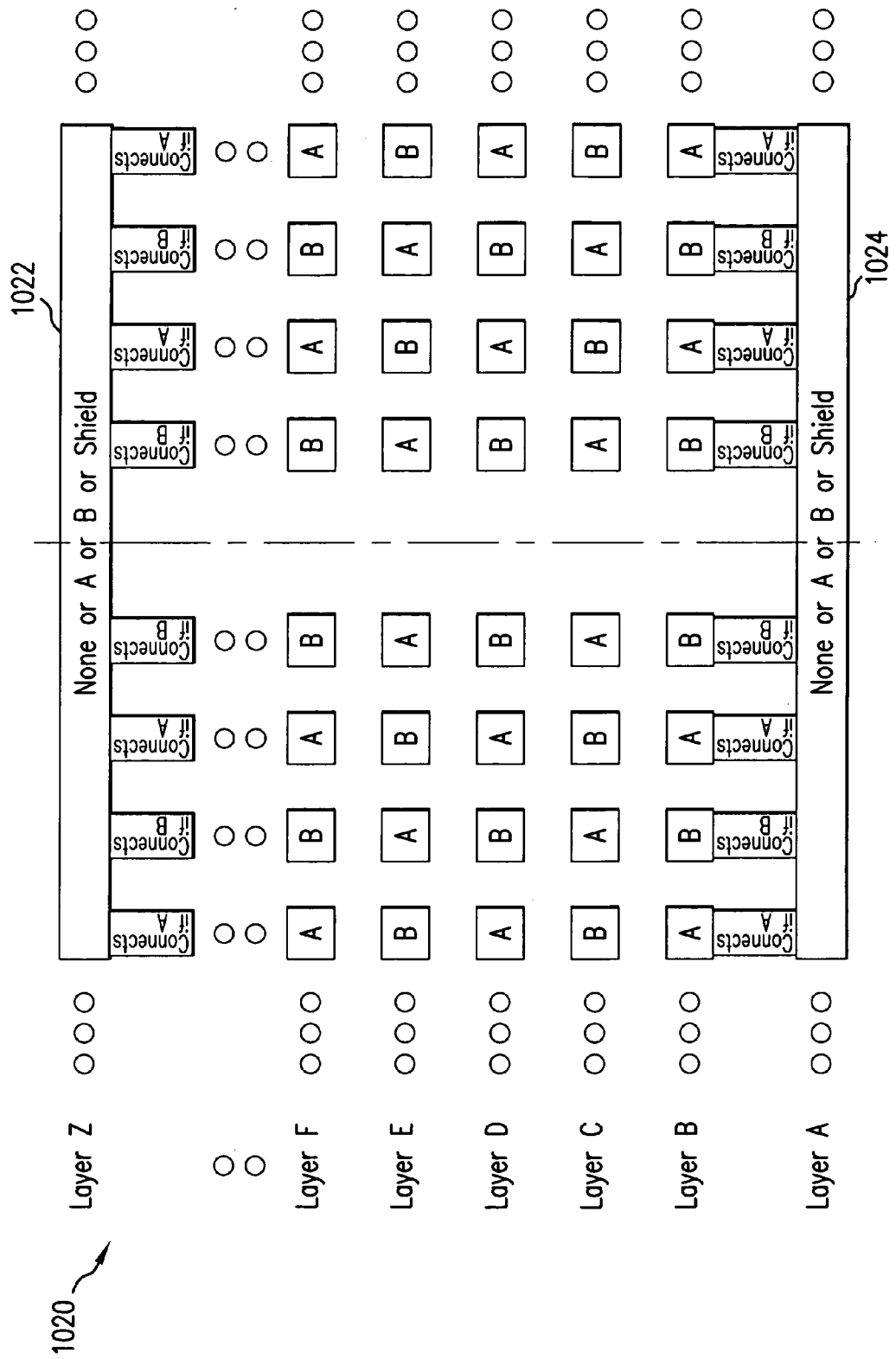
FIG. 10B is a schematic diagram depicting a cross sectional view (A—A) of the third scalable integrated circuit spiral-structure high density capacitor of FIG. 10A.

FIG. 10B is a schematic diagram depicting a cross sectional view (A—A) (see FIG. 10A) of the third scalable integrated circuit spiral-structure high density capacitor 1020. As shown in FIG. 10B, capacitor 1020 is scalable in that it can be formed using a selected number of metal layers such as, for example, metal layer 1000, and the area of these metal layers can be varied. Optional shields 1022 and/or 1024 can be included as the top-most and/or bottom-most layers of capacitor 1020, as well as optional side shields, to help reduce unwanted parasitic capacitance.

Figure 10C:
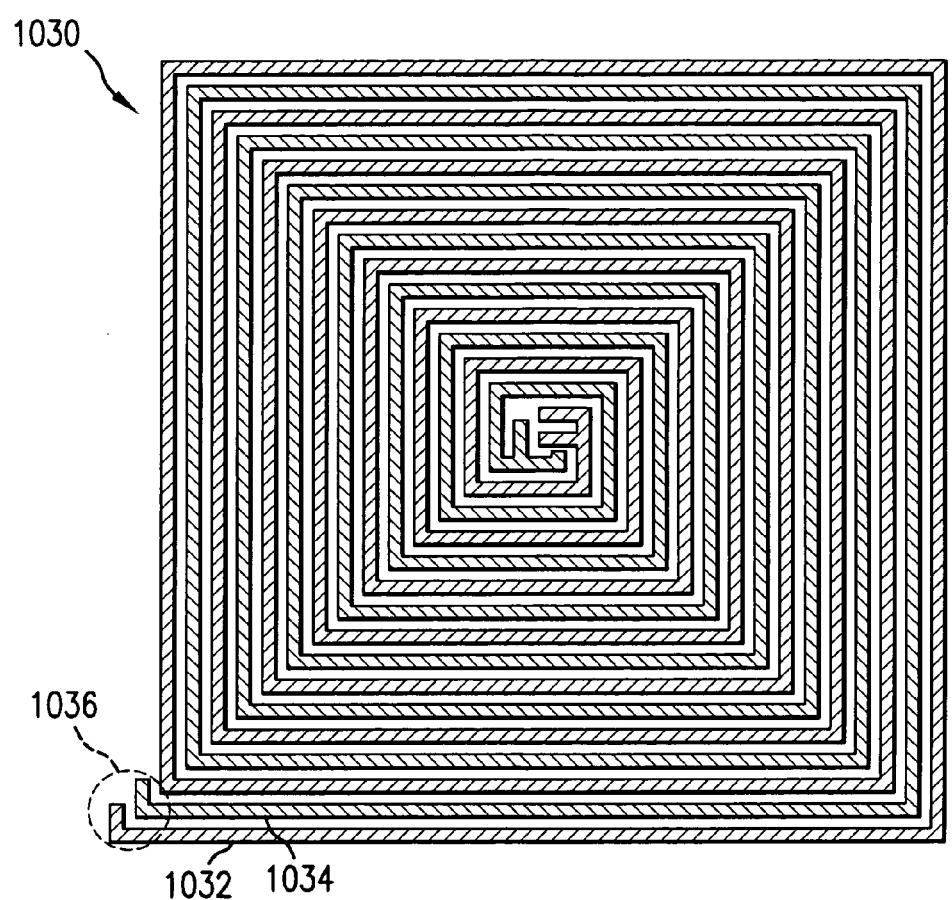
FIG. 10C is a schematic diagram depicting a top view of a second example metal layer for the third scalable integrated circuit spiral-structure high density capacitor of FIG. 10A.

FIG. 10C is a schematic diagram depicting a top view of a second example metal layer 1030 for the third scalable integrated circuit spiral-structure high density capacitor 1020. Metal layer 1030 includes a first metallization pattern 1032 and a second metallization pattern 1034. The metallization patterns 1032 and 1034 are interleaved with one another in a spiral arrangement as depicted in FIG. 10C. In region 1036 of capacitor 1020, note that the end of metallization pattern 1032 does not wrap around the end of metallization pattern 1034, as is shown in region 1006 (see FIG. 10A). Note also the similarities and differences present in the center of the spiral of metal layers 1000 and 1030. These differences between the metal layers enable, for example, every other metal layer (e.g., metal layers B, D, and F) to be connected to a first terminal (e.g., A) of capacitor 1020, and the remaining metal layers (e.g., C and E) to be connected to a second terminal (e.g., B) of capacitor 1020. Structures other than that shown, however, can be used to achieve this interconnection.

Figure 10E:
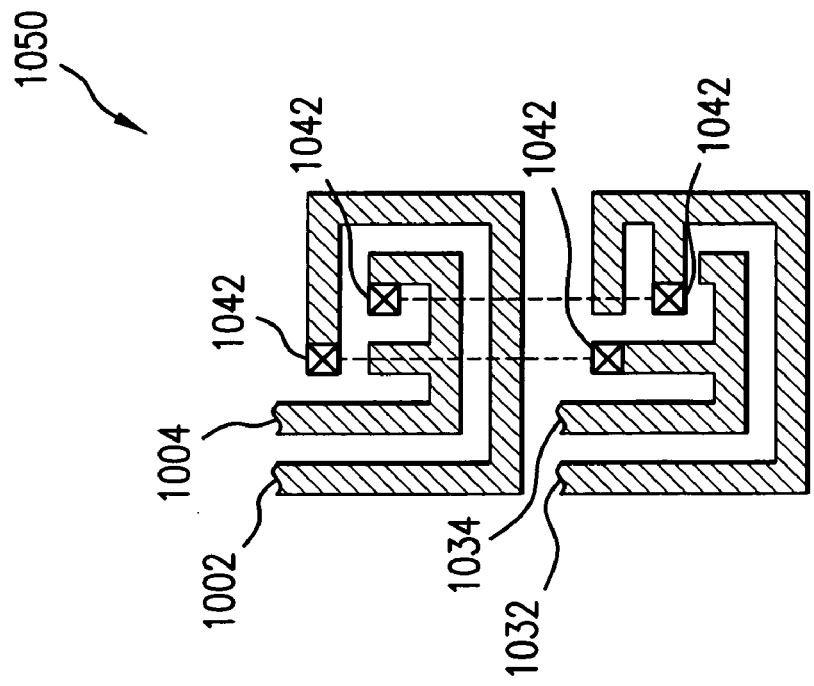
FIG. 10E is a schematic diagram depicting a top view of a second portion of the example via layer used to connect the metal layer of FIG. 10A to the metal layer of FIG. 10C.
Figure 10D:
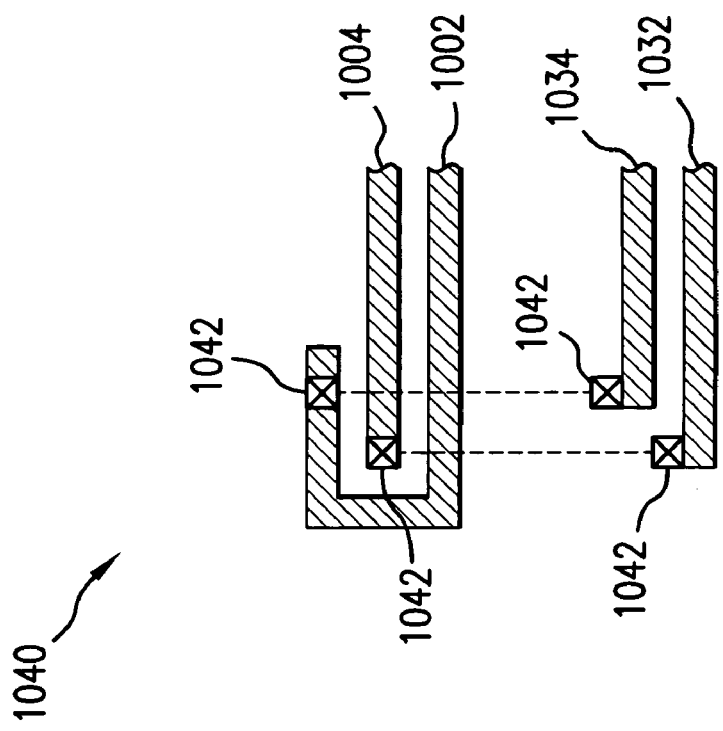
FIG. 10D is a schematic diagram depicting a top view of a first portion of an example via layer of the third scalable integrated circuit spiral-structure high density capacitor of FIG. 10A used to connect the metal layer of FIG. 10A to the metal layer of FIG. 10C.

FIG. 10D is a schematic diagram depicting a top view of a first portion 1040 of an example via layer of the third scalable integrated circuit spiral-structure high density capacitor 1020. The example via layer is used to couple metal layer 1000 to metal layer 1030. As shown in FIG. 10D, a first via 1042 couples an end of metallization pattern 1002 to an end of metallization pattern 1032. A second via 1042 couples an end of metallization pattern 1004 to an end of metallization pattern 1034.

FIG. 10E is a schematic diagram depicting a top view of a second portion 1050 of the example via layer used to couple metal layer 1000 to metal layer 1030. As shown in FIG. 10E, a via 1042 couples a second end of metallization pattern 1002 to a second end of metallization pattern 1032. A via 1042 also couples a second end of metallization pattern 1004 to a second end of metallization pattern 1034. In embodiments, vias in addition to these four vias are used to couple a metal layer 1000 to a metal layer 1030.

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A scalable integrated circuit capacitor, comprising:
a first metal layer and a second metal layer each including a first metallization pattern and a second metallization pattern, said first metallization pattern and said second metallization patterns each having a plurality of finger tracks approximately perpendicular to a backbone track wherein said plurality of finger tracks of said first metallization pattern are interlaced with said plurality of finger tracks of said second metallization pattern; and
a via layer including a plurality of vias that connect said plurality of finger tracks of said first metallization pattern of said first metal layer to said plurality of finger tracks of said first metallization pattern of said second metal layer and said plurality of finger tracks of said second metallization pattern of said first metal layer to said plurality of finger tracks of said second metallization pattern of said second metal layer.

2. The capacitor of claim 1, wherein said plurality of finger tracks of said first metallization pattern of said first metal layer are staggered with respect to said plurality of finger tracks of said first metallization pattern of said second metal layer.

3. The capacitor of claim 1, wherein said plurality of finger tracks of said first metallization pattern of said first metal layer are rotated approximately ninety degrees with respect to said plurality of finger tracks of said first metallization pattern of said second metal layer.

4. The capacitor of claim 1, wherein said plurality of vias couple said backbone track of said first metallization pattern of said first metal layer to said backbone track of said first metallization pattern of said second metal layer and said backbone track of said second metallization pattern of said first metal layer to said backbone track of said second metallization pattern of said second metal layer.

5. The capacitor of claim 1, further comprising:
a shield proximate to said first metal layer that reduces unwanted parasitic capacitance.

6. The capacitor of claim 5, wherein said shield is coupled to said first metallization pattern of said first metal layer.

* * * * *